US 6,720,829 B2

(12) United States Patent
Matsuyoshi et al.

(10) Patent No.: US 6,720,829 B2
(45) Date of Patent: Apr. 13, 2004

(54) DISTORTION-COMPENSATED AMPLIFYING CIRCUIT

(75) Inventors: Toshimitsu Matsuyoshi, Katano (JP); Kaoru Ishida, Shijonawate (JP); Seiji Fujiwara, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/323,836

(22) Filed: Dec. 20, 2002

(65) Prior Publication Data

US 2003/0117217 A1 Jun. 26, 2003

(30) Foreign Application Priority Data

Dec. 25, 2001 (JP) ........................................ 2001-391713

(51) Int. Cl.$^7$ ............................. H03F 1/26; H03F 1/30
(52) U.S. Cl. ........................................ 330/149; 330/151
(58) Field of Search ................................. 330/149, 151

(56) References Cited

U.S. PATENT DOCUMENTS 5,644,268 A 7/1997 Hang
6,285,255 B1 * 9/2001 Luu et al. .................. 330/149

FOREIGN PATENT DOCUMENTS

JP 2000-261252 9/2000

* cited by examiner

Primary Examiner—Michael B Shingleton
(74) Attorney, Agent, or Firm—Wenderoth, Lind & Ponack, L.L.P.

(57) ABSTRACT

Provided is a distortion-compensated amplifying circuit capable of suppressing distortion without attenuating a level of carrier components, and further obtaining a larger amount of suppression of distortion, which has not been achievable by conventional distortion-compensated amplifying circuit using a pre-distortion technique. A balanced type amplifying circuit is structured such that amplifiers 115 and 116 placed in parallel are sandwiched by 90-degree hybrid circuits 114 and 117. The 90-degree hybrid circuit 114 is supplied with an original signal including carrier components and a distortion signal including distortion equal in amplitude and opposite in phase (having a phase difference of 180 degrees) to distortion that occurs when the original signal is amplified by the amplifiers 115 and 116. The 90-degree hybrid circuit 114 performs a process of differential amplification with a phase difference of 180 degrees between the original signal and the distortion signal. Then, the amplified original signal and distortion signal outputted from the 90-degree hybrid circuit 117 are combined by a directional coupler 118, thereby canceling distortion components included in both signals with each other.

31 Claims, 17 Drawing Sheets

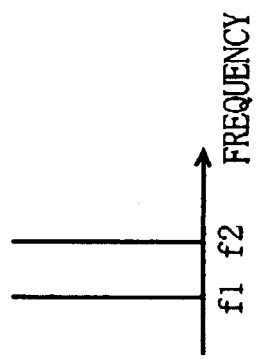
FIG. 2A TERMINAL a
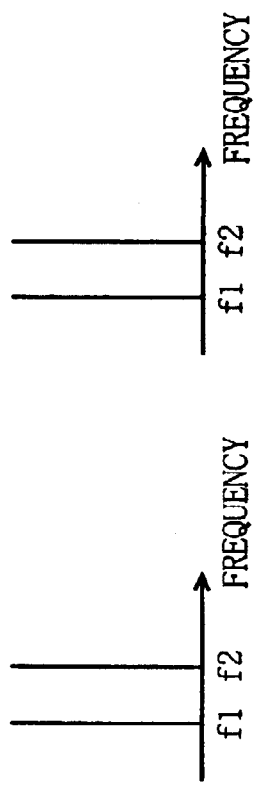
FIG. 2B TERMINAL b
CARRIER : 0°
FIG. 2C TERMINAL c
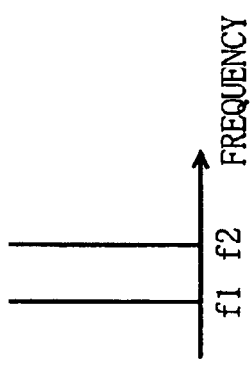
FIG. 2D TERMINAL d
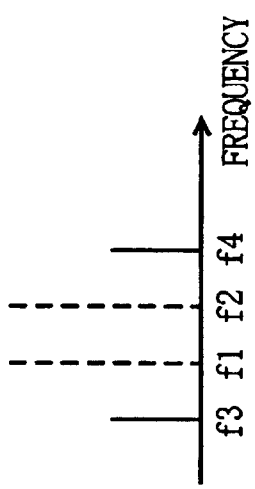
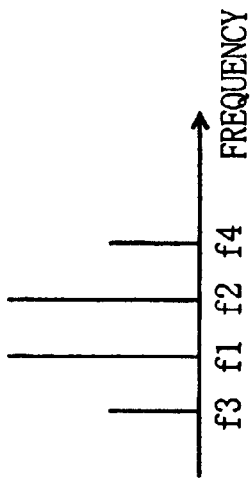
FIG. 2E TERMINAL e
IM3 : α+180°

TERMINAL f

TERMINAL g

TERMINAL h

TERMINAL i

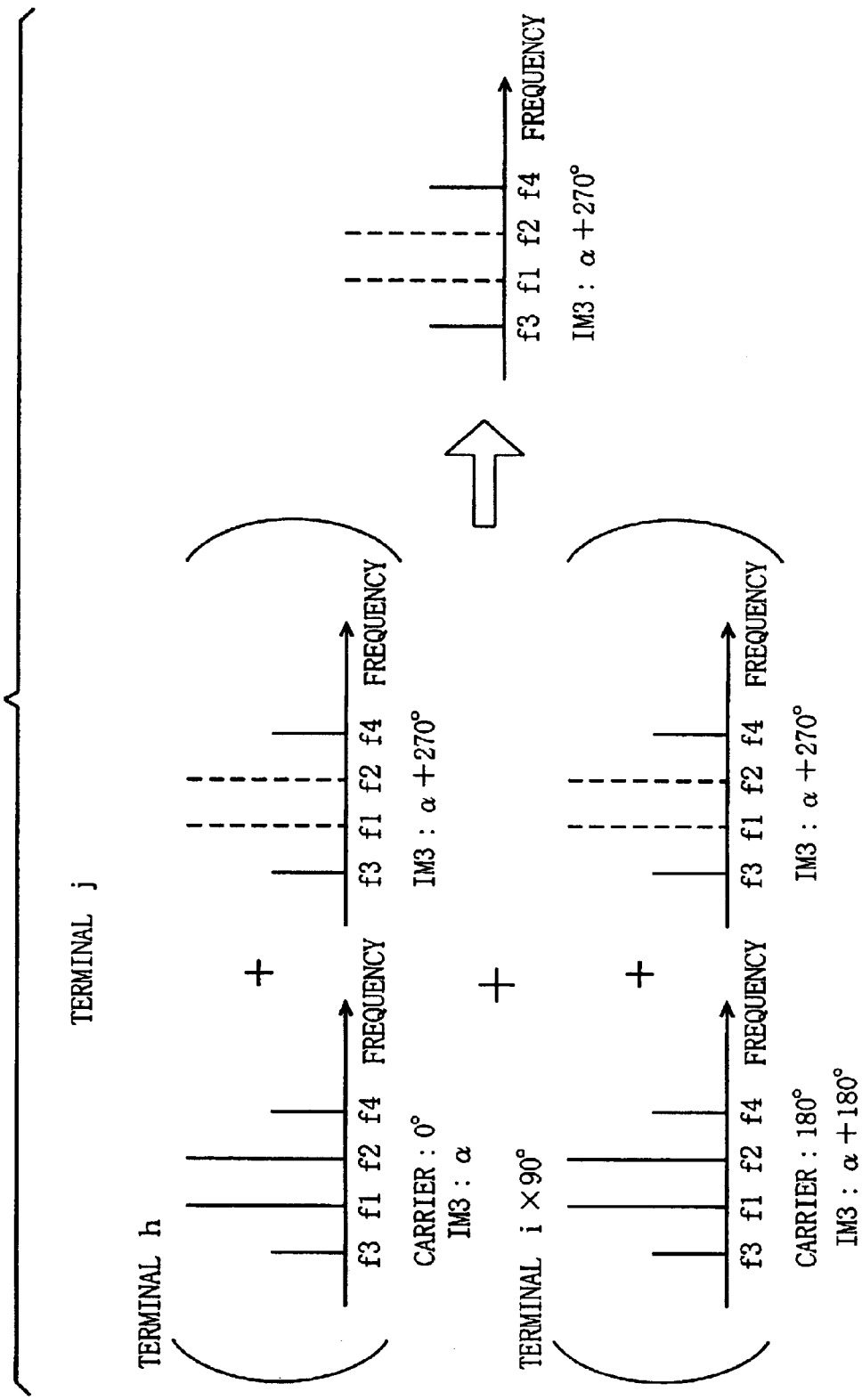

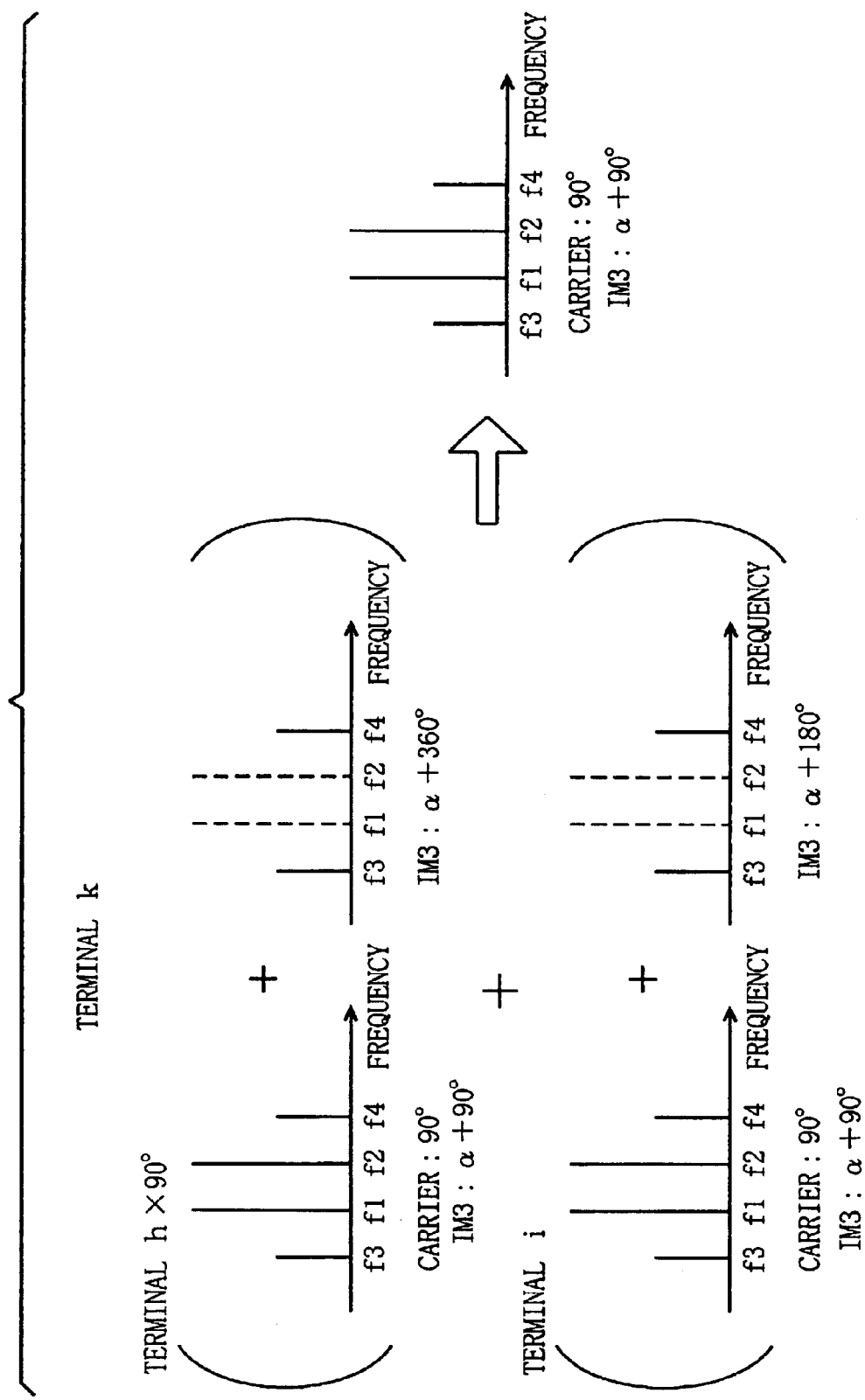

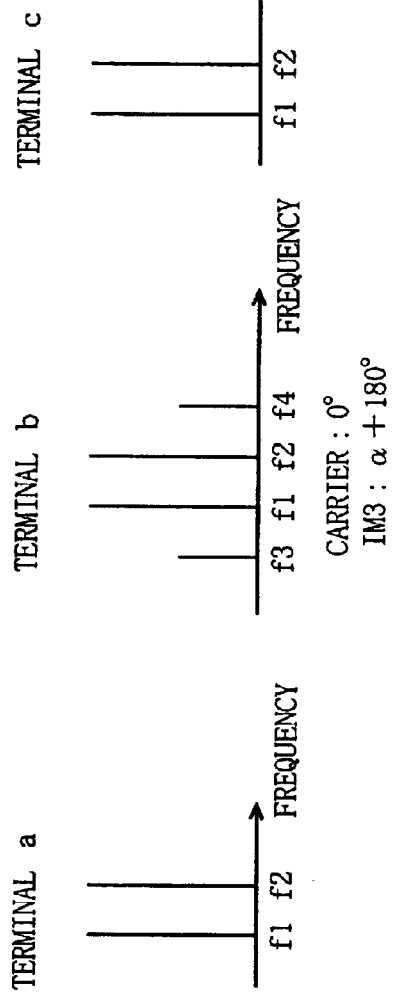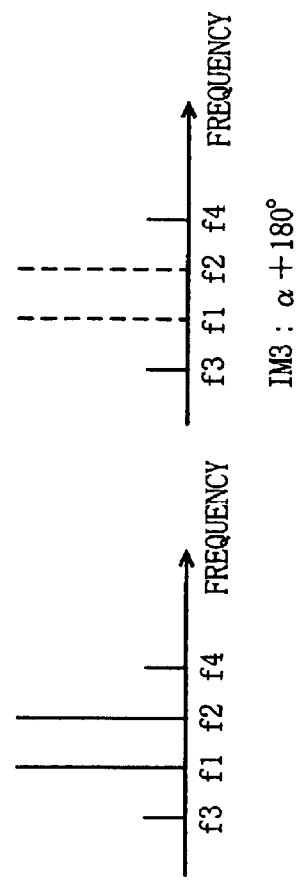

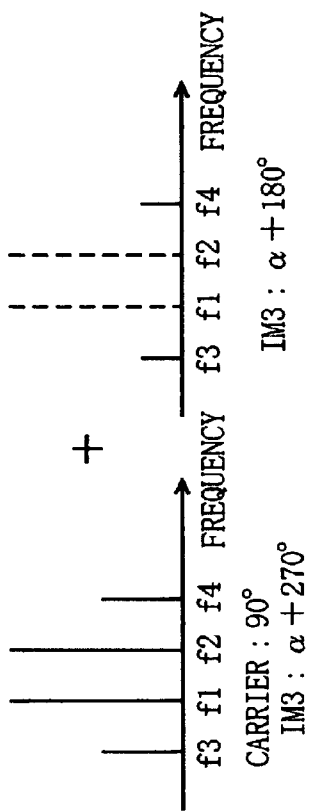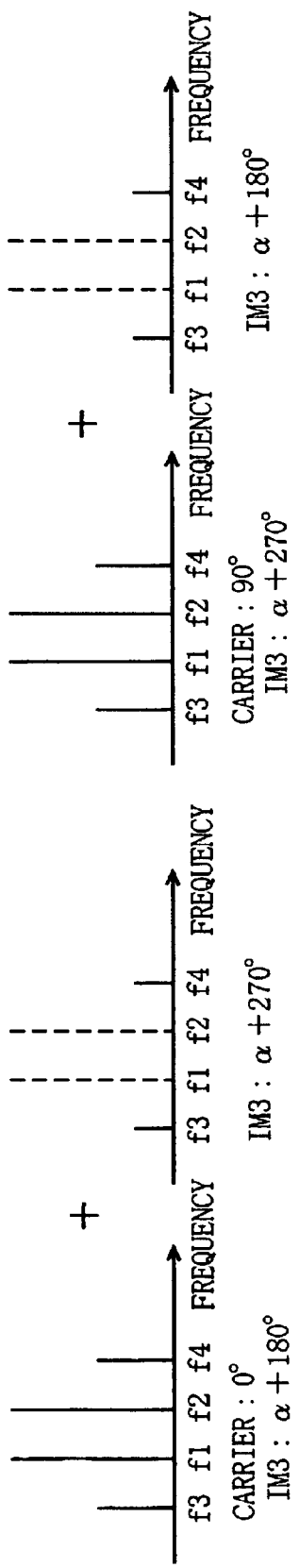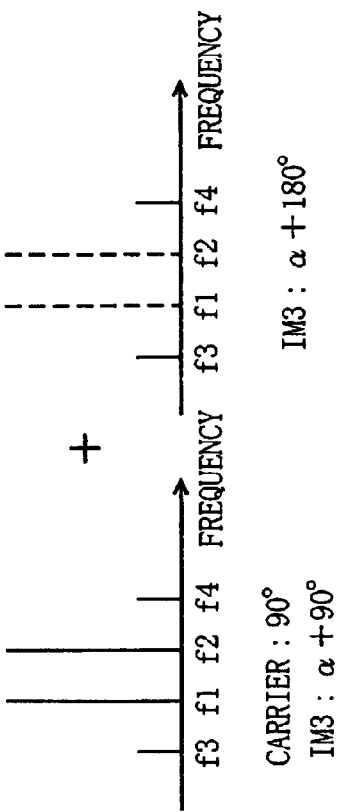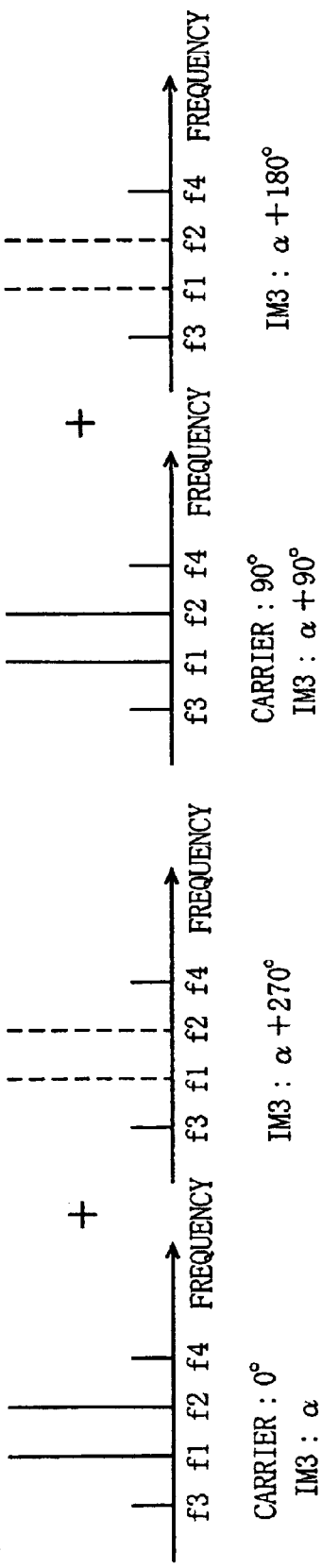

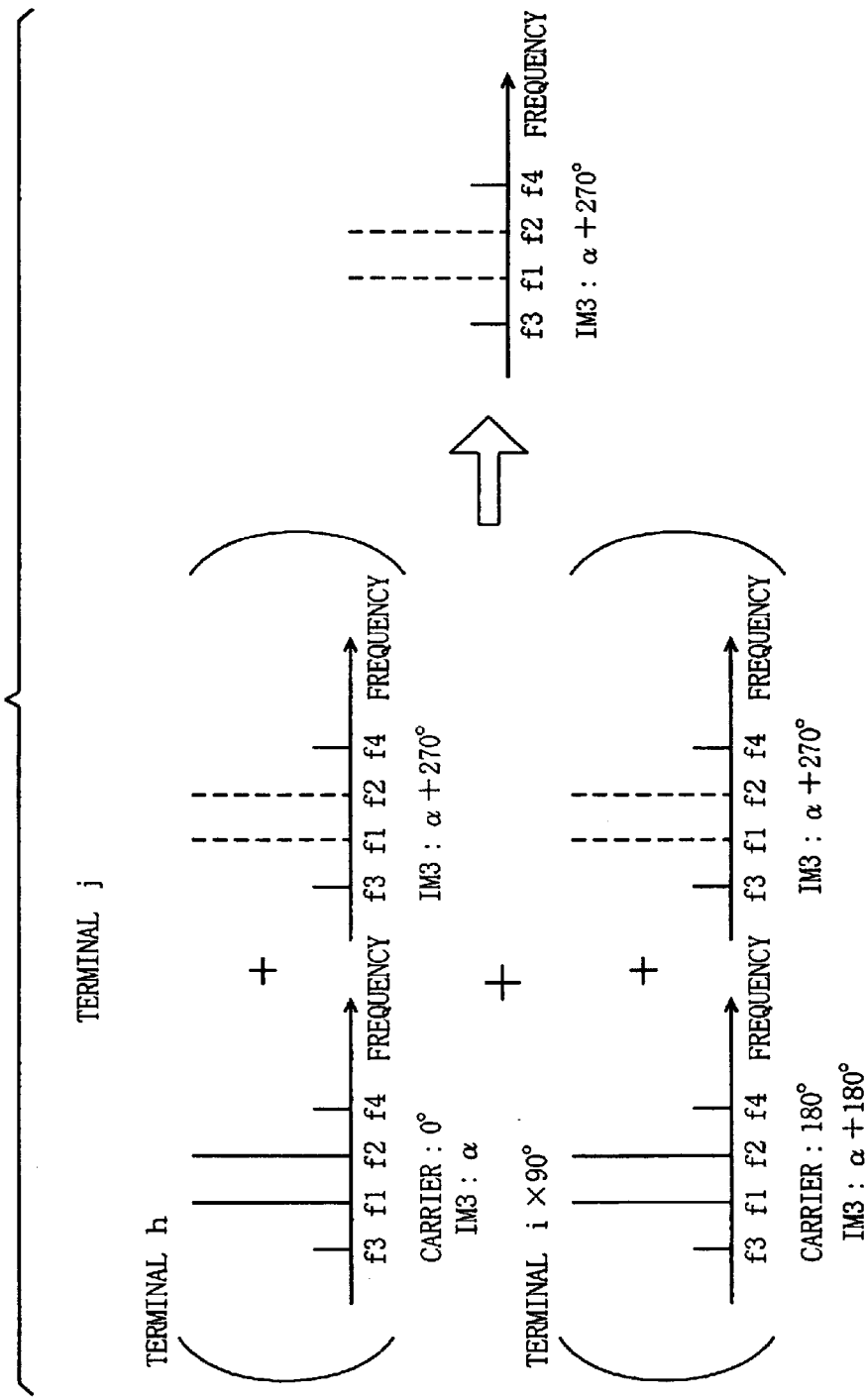

DISTORTION-COMPENSATED AMPLIFYING CIRCUIT

BACKGROUND OF THE INVENTION

1. Field of the Invention

The present invention relates to distortion-compensated amplifying circuits. More specifically, the present invention relates to a distortion-compensated amplifying circuit that is used typically in a mobile communications base station for cellular phones and is capable of amplifying a signal and compensating for distortion that occurs at the time of amplification.

2. Description of the Background Art

In recent years, a transmission apparatus at a base station for mobile communications devices collectively amplifies a large number of signal channels, requiring a highly-efficient, more linear power amplifier. To increase the linearity of such a power amplifier, an amplifying circuit capable of compensating for distortion has to be adopted.

FIG. 17 shows one exemplary configuration of a conventional distortion-compensated amplifying circuit. In FIG. 17, the conventional distortion-compensated amplifying circuit includes an input terminal 601, an output terminal 602, a power distributor 603, a delay circuit 604, a distortion generating circuit 605, a variable attenuator 606, a phase changer 607, a power combiner 608, a power amplifier 609, a directional coupler 610, and a controller 611.

In the above-structured distortion-compensated amplifying circuit, a carrier signal supplied from the input terminal 601 is distributed into two by the power distributor 603. Based on one of these two carrier signals obtained by distribution, the distortion generating circuit 605 generates a distortion signal. This distortion signal is adjusted in amplitude and phase by the variable attenuator 606 and the phase changer 607, respectively, and is then given to the power combiner 608. The other one of the two carrier signals obtained by distribution is delayed by the delay circuit 604, and is then forwarded to the power combiner 608. The power combiner 608 combines the distortion signal and the carrier signal with each other for input to the power amplifier 609. The power amplifier 609 amplifies the received signal for output to the output terminal 602.

Provided between the power amplifier 609 and the output terminal 602 is the directional coupler 610, where part of the signal supplied by the power amplifier 609 is branched to the controller 611. The controller 611 controls the variable attenuator 606 and the phase changer 607 so that the distortion signal supplied to the power combiner 608 becomes equal in amplitude and opposite in phase to intermodulation distortion (hereinafter simply referred to as "distortion") that occurs when the power amplifier 609 amplifies the carrier signal.

As described above, in the distortion-compensated amplifying circuit of FIG. 17, a distortion signal is generated by the power amplifier 609 so as to be equal in amplitude and opposite in phase to distortion that may occur when the power amplifier 609 amplifies the carrier signal. The distortion signal is then added in advance to the carrier signal to be supplied to the power amplifier 609. This means that a distortion component equal in amplitude and opposite in phase to possible distortion is supplied to an input side of the amplifier. With this, distortion that occurs in the power amplifier 609 is reduced. Such a distortion compensation scheme is called a pre-distortion technique, which is disclosed in Japanese Patent Laid-Open Publication No. 2000-261252, for example.

However, the conventional distortion-compensated amplifying circuit adopting the pre-distortion technique as disclosed in FIG. 17 has the following problems. The distortion signal to be supplied from the distortion generating circuit 605 via the variable attenuator 606 and the phase changer 607 to the power amplifier 609 includes a carrier component as well as a distortion component. This carrier component is also adjusted in amplitude and phase in the variable attenuator 606 and the phase changer 607. Therefore, the power combiner 608 will receive a carrier component opposite in phase to the carrier signal received via the delay circuit 604. Therefore, part of the carrier signal is cancelled by the carrier component opposite in phase thereto, thereby causing attenuation in carrier level. Such attenuation in carrier level requires an additional amplifier in order to compensate for lost power to satisfy a desired carrier level.

Moreover, in the circuit as illustrated in FIG. 17, amplification of the received distortion component and suppression of the distortion are simultaneously carried out at the power amplifier 609. Therefore, in practice, it is very difficult to obtain a sufficiently large amount of distortion.

SUMMARY OF THE INVENTION

The present invention is made in order to solve the above problems. An object of the present invention is to provide a distortion-compensated amplifying circuit capable of suppressing a larger amount of distortion, compared with conventional distortion-compensated amplifying circuits, without attenuation in level of a carrier component.

The present invention has the following features to attain the object mentioned above.

A first aspect of the present invention is directed to a distortion-compensated amplifying circuit for amplifying a signal and compensating for distortion that occurs at a time of amplifying the signal, including:

two amplifying sections placed in parallel each for performing a signal amplifying process;

a first combining and distributing section supplied with an original signal including a carrier component and a first distortion signal having a frequency equal to a frequency of distortion that occurs when the original signal is amplified by each of the two amplifying sections, the first combining and distribution section for combining the original signal and the first distortion signal together and then distributing the combined signal into two signals for output to the two amplifying sections;

a second combining and distributing section for combining the two signals supplied from the two amplifying sections and then distributing the combined signal into two signals; and a combining section for combining the two signals supplied from the second combining and distributing section for output, wherein each of the first and second combining and distributing sections is a hybrid circuit that outputs two signals with a predetermined phase difference.

In the above first aspect, two amplifying sections are placed between first and second hybrid circuits to form balanced circuitry. When the first hybrid circuit is supplied with the original signal and the distortion signal, the second hybrid circuit outputs two signals: a signal including only a distortion component delayed in phase with respect to the received distortion signal, and a signal including a carrier component delayed in phase with respect to the received original signal and a distortion component advanced in phase with respect to the received distortion signal. When these output signals are combined, at least part of the distortion components included therein are canceled with each other because these components are out of phase. Consequently, distortion included in the combined signal is suppressed (this suppression is an effect of the post-distortion technique). In this case, the carrier component is not cancelled because it is included in only one of the two output signals. Therefore, attenuation in carrier level can be prevented.

This distortion suppression effect achieved by the post-distortion technique becomes larger, as the distortion components included in the two signals produced from the second hybrid circuit are closer to being opposite in phase (having a phase difference of 180 degrees) and to being equal in amplitude to each other. When these distortion components become opposite in phase and equal in amplitude to each other, a maximum suppression effect can be obtained. Therefore, as described below in a fourth aspect, when 90-degree hybrid circuits are used, the distortion signal supplied to the first hybrid circuit is preferably shifted in phase by 180 degrees from distortion that occurs in the amplifying sections. Moreover, as described below in a sixth aspect, it is most preferable that the distortion signal be equal in amplitude to the distortion that occurs in the amplifying sections.

That is, as mentioned above, when the distortion signal supplied to the first hybrid circuit is shifted in phase by 180 degrees from the distortion that occurs in the amplifying sections, the received distortion signal and the distortion have a phase difference of 90 degrees, and therefore these signals do not interfere with each other. In view of this, the second hybrid circuit outputs two signals: a signal including only a distortion component delayed in phase by 90 degrees with respect to a first distortion signal supplied to the first hybrid circuit, and a signal including a carrier component delayed in phase by 90 degrees with respect to the original signal supplied with the first hybrid circuit and a distortion component advanced in phase by 90 degrees with respect to the first distortion signal supplied with the first hybrid circuit. Then, when these two signals are combined, the distortion components opposite in phase to each other are completely canceled if they are equal in amplitude to each other.

In the first aspect, the post-distortion technique carried out for suppressing distortion is such that the original signal and the distortion signal are amplified by the amplifier including two balanced hybrid amplifying sections (that is, differential amplification is carried out) so as to have a phase difference. Then, the amplified original signal and distortion signal are combined. In this case, a process of amplifying the distortion signal and a process of suppressing distortion that occurs when the original signal is amplified are performed separately. Therefore, it is possible to obtain a larger amount of suppression of distortion, compared with a conventional distortion-compensated amplifying circuit using the pre-distortion technique.

Still further, the second hybrid circuit outputs a signal including only the distortion component. Therefore, based on the power of this signal, the amplitude and phase of the distortion signal supplied to the first hybrid circuit can be easily performed as described below in a seventh or twelfth aspect.

According to a second aspect based on the first aspect, the distortion-compensated amplifying circuit further includes a signal input section for inputting the original signal and the first distortion signal to the first combining and distributing section.

In the above second aspect, the signal input section supplies the above-mentioned original signal and first distortion signal to the first combining and distributing section.

According to a third aspect based on the second aspect, the signal input section includes a phase adjusting section for adjusting a phase of the original signal and/or a phase of the first distortion signal to be supplied to the first combining and distributing section.

In the above third aspect, the phase adjusting section adjusts the phase of the original signal and/or the phase of the first distortion signal.

According to the fourth aspect based on the third aspect, each of the first and second combining and distributing sections is a 90-degree hybrid circuit that outputs the two signals with a phase difference of 90 degrees, and the phase adjusting section adjusts the phase of the original signal and the phase of the first distortion signal so that the first distortion signal to be supplied to the first combining and distributing section has a phase difference of 180 degrees with respect to the distortion that occurs when the original signal is amplified by each of the amplifying sections.

In the above fourth aspect, the distortion components included in the two signals supplied by the second hybrid circuit are opposite in phase to each other. Therefore, a high distortion suppression effect can be obtained.

According to a fifth aspect based on the fourth aspect, the signal input section further includes an amplitude adjusting section for adjusting an amplitude of the first distortion signal to be supplied to the first combining and distributing section.

In the above fifth aspect, the amplitude adjusting section adjusts the amplitude of the first distortion signal.

According to the sixth aspect according to the fifth aspect, the amplitude adjusting section adjusts the amplitude of the first distortion signal to become equal to an amplitude of the distortion that occurs when the original signal is amplified by each of the amplifying sections.

In the above sixth aspect, the distortion components included in the two signals supplied by the second hybrid circuit are opposite in phase and equal in amplitude to each other. Therefore, the highest distortion suppression effect can be obtained.

According to the seventh aspect based on the sixth aspect, the second combining and distributing section outputs a signal only including a distortion component delayed in phase by 90 degrees with respect to the first distortion signal supplied to the first combining and distributing section; and a signal including a carrier component delayed in phase by 90 degrees with respect to the original signal supplied to the first combining and distributing section, and a distortion component advanced in phase by 90 degrees with respect to the first distribution signal supplied to the first combining and distributing section, and the signal input section further includes a control section for controlling the phase adjusting section and the amplitude adjusting section based on a power of the signal including only the distortion component.

In the above seventh aspect, the control section detects the power of one of the signals (that includes only the distortion component) supplied by the second hybrid circuit. Based on the detection results, the control section controls the phase adjusting section and the amplitude adjusting section. With this, even if the amplitude and phase of the distortion that occurs in the amplifying sections are varied due to changes in environmental temperature, for example, it is possible to follow the changes, thereby keeping the high distortion suppression effect.

According to an eighth aspect based on the second aspect, the signal input section includes
  a distributing section for distributing the original signal into two signals; and
  a first distortion generating section for generating the first distortion signal based on one of the two signals distributed by the distributing section.

In the above eighth aspect, the original signal is distributed into two signals and, based on one of the two signals, a first distortion signal is generated. To the first combining and distributing section, the other of the two signals and the first distortion signal are supplied.

According to a ninth aspect based on the second aspect, the signal input section includes a distortion adding section for adding, to the original signal, a second distortion component having a frequency equal to a frequency of the distortion that occurs when the original signal is amplified by each of the amplifying sections.

In the above ninth aspect, the distortion adding section adds a second distortion component to the original signal. The first hybrid circuit is supplied with this original signal added with the second distortion component and a distortion signal including the first distortion component. The first hybrid circuit distributes each of the received signals into two signals, and outputs these signals with a phase difference of 90 degrees to each amplifying section. When amplifying the original signal added with the second distortion component, each amplifying section performs a process of suppressing distortion with the pre-distortion technique. As a result, the amount of distortion is reduced, compared with a case where the second distortion component is not added. With this, the process of suppressing distortion is performed in the combining section with the post-distortion technique and also in each amplifying section with the pre-distortion technique. Thus, a higher distortion suppression effect can be obtained.

Furthermore, with the combination of the pre-distortion and post-distortion techniques for suppressing distortion, the level of the first distortion signal subjected to post-distortion can be reduced, compared with a case where only the post-distortion technique is performed for suppressing distortion. As a result, it is possible to obtain effects similar to those obtained when the amount of attenuation of the carrier components are reduced.

According to a tenth aspect based on the ninth aspect, the signal input section further includes a phase adjusting section for adjusting a phase of the original signal added with the second distortion component and/or a phase of the first distortion signal to be supplied to the first combining and distributing section.

In the above tenth aspect, the phase adjusting section adjusts the phase of the original signal added with the second distortion and/or the phase of the first distortion signal.

According to an eleventh aspect based on the tenth aspect, each of the first and second combining and distributing sections is a 90-degree hybrid circuit that outputs the two signals with a phase difference of 90 degrees, and
  the phase adjusting section adjusts the phase of the first distortion signal and the phase of the original signal so that the first distortion signal to be supplied to the first combining and distributing section has a phase difference of 180 degrees with respect to the distortion that occurs when the original signal added with the second distortion component is amplified by each of the amplifying sections.

In the above eleventh aspect, the distortion components included in the two signals supplied by the second hybrid circuit are opposite in phase to each other. Therefore, a high distortion suppression effect can be obtained.

According to the twelfth aspect based on the tenth aspect, the signal input section further includes an amplitude adjusting section for adjusting an amplitude of the first distortion signal to be supplied to the first combining and distributing section.

In the above twelfth aspect, the amplifying adjusting section adjusts the amplitude of the first distortion signal.

According to a thirteenth aspect based on the twelfth aspect, the amplitude adjusting section adjusts the amplitude of the first distortion signal to become equal to an amplitude of the distortion that occurs when the original signal added with the second distortion component is amplified by each of the amplifying sections.

In the above thirteenth aspect, the distortion components included in the two signals supplied by the second hybrid circuit are opposite in phase and equal in amplitude to each other. Therefore, the maximum distortion suppression effect can be obtained.

According to a fourteenth aspect based on the thirteenth aspect, the second combining and distributing section outputs
  a signal only including a distortion component delayed in phase by 90 degrees with respect to the first distortion signal supplied to the first combining and distributing section; and
  a signal including a carrier component delayed in phase by 90 degrees with respect to the original signal supplied to the first combining and distributing section, and a distortion component advanced in phase by 90 degrees with respect to the first distribution signal supplied to the first combining and distributing section, and
  the signal input section further includes a control section for controlling the phase adjusting section and the amplitude adjusting section based on a power of the signal including only the distortion component.

In the above fourteenth aspect, the control section detects the power of one of the signals (that includes only the distortion component) supplied by the second hybrid circuit. Based on the detection results, the control section controls the phase adjusting section and the amplitude adjusting section. With this, even if the amplitude and phase of the distortion that occurs in the amplifying sections are varied due to changes in environmental temperature, for example, it is possible to follow the changes, thereby keeping the high distortion suppression effect.

According to a fifteenth aspect based on the ninth aspect, the signal input section further includes an amplitude adjusting section for adjusting an amplitude of the first distortion signal to be supplied to the first combining and distributing section.

In the above fifteenth aspect, the amplifying adjusting section adjusts the amplitude of the first distortion signal.

According to a sixteenth aspect based on the fifteenth aspect, the amplitude adjusting section adjusts the amplitude of the first distortion signal to become equal to an amplitude of the distortion that occurs when the original signal is amplified by each of the amplifying sections.

In the above sixteenth aspect, the distortion components included in the two signals supplied by the second hybrid circuit are equal in amplitude to each other. Therefore, a high distortion suppression effect can be obtained.

According to a seventeenth aspect based on the sixteenth aspect, the second combining and distributing section outputs a signal only including a distortion component delayed in phase by 90 degrees with respect to the first distortion signal supplied to the first combining and distributing section; and a signal including a carrier component delayed in phase by 90 degrees with respect to the original signal supplied to the first combining and distributing section, and a distortion component advanced in phase by 90 degrees with respect to the first distribution signal supplied to the first combining and distributing section, and the signal input section further includes a control section for controlling the phase adjusting section and the amplitude adjusting section based on a power of the signal including only the distortion component.

In the above seventeenth aspect, the control section detects the power of one of the signals (that includes only the distortion component) supplied by the second hybrid circuit. Based on the detection results, the control section controls the phase adjusting section and the amplitude adjusting section. With this, even if the amplitude and phase of the distortion that occurs in the amplifying sections are varied due to changes in environmental temperature, for example, it is possible to follow the changes, thereby keeping the high distortion suppression effect.

According to an eighteenth aspect based on the ninth aspect, the signal input section further includes a distributing section for distributing the original signal into two signals; and a first distortion generating section for generating the first distortion signal based on one of the two signals distributed by the distributing section, and the distortion adding section generates the second distortion component based on another of the two signals distributed by the distributing section, and adds the generated second distortion component to the other of the two signals.

In the above eighteenth aspect, the original signal is distributed into two signals and, based on one of the two signals, a first distortion signal is generated. Also, a second distortion component is generated based on the other of the two signals, and is then added to the other signal. The first combining and distributing section is supplied with the first distortion signal and the other signal added with the second distortion component.

According to a nineteenth aspect based on the ninth aspect, the signal input section further includes:

a first distributing section for distributing the original signal into two signals;

a first distortion generating section for generating the first distortion signal based on one of the two signals distributed by the first distributing section from the original signal; and a second distributing section for distributing the first distortion signal generated by the first distortion generating section into two signals, and the distortion adding section adds, as the second distribution component, one of the two signals distributed by the second distributing section from the first distortion signal to another of the two signals distributed by the first distributing section from the original signal.

In the above nineteenth aspect, the original signal is distributed into two signals and, based on one of the two signals, generates a first distortion signal. The first distortion signal is further distributed in two signals, and one of these two signals is added as a second distortion to the other original signal. The first combining and distributing section is supplied with the first distortion signal and the other original signal added with the second distortion component.

Twentieth, twenty-second, twenty-fourth, and twenty-sixth aspects correspond to distortion-compensated amplifying circuits according to first to fourth embodiments, respectively.

According to twenty-first, twenty-third, twenty-fifth, and twenty-seventh aspects based on the twentieth, twenty-second, twenty-fourth, and twenty-sixth aspects, respectively, a control section is provided to control the vector adjusting section based on one of the signals supplied by the second power combining and distributing section.

Twenty-eighth through thirty-first aspects of the present invention are directed to feed-forward type amplifiers using any of the distortion-compensated amplifying circuits according to the twentieth, twenty-second, twenty-fourth, and twenty-sixth aspects.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A–2E are illustrations showing signal spectra at terminals a–e, respectively, of the distortion-compensated amplifying circuit according to the first embodiment of the present invention;

FIG. 4 is an illustration showing a signal spectrum at a terminal j of the distortion-compensated amplifying circuit according to the first embodiment of the present invention;

FIG. 5 is an illustration showing a signal spectrum at a terminal k of the distortion-compensated amplifying circuit according to the first embodiment of the present invention;

FIGS. 10A–10E are illustrations showing signal spectra at terminals a–e, respectively, of the distortion-compensated amplifying circuit according to the second embodiment of the present invention;

FIGS. 11A–11D are illustrations showing signal spectra at terminals f–i, respectively, of the distortion-compensated amplifying circuit according to the second embodiment of the present invention;

FIG. 12 is an illustration showing a signal spectrum at a terminal j of the distortion-compensated amplifying circuit according to the second embodiment of the present invention;

DESCRIPTION OF THE PREFERRED EMBODIMENTS

Figure 1:
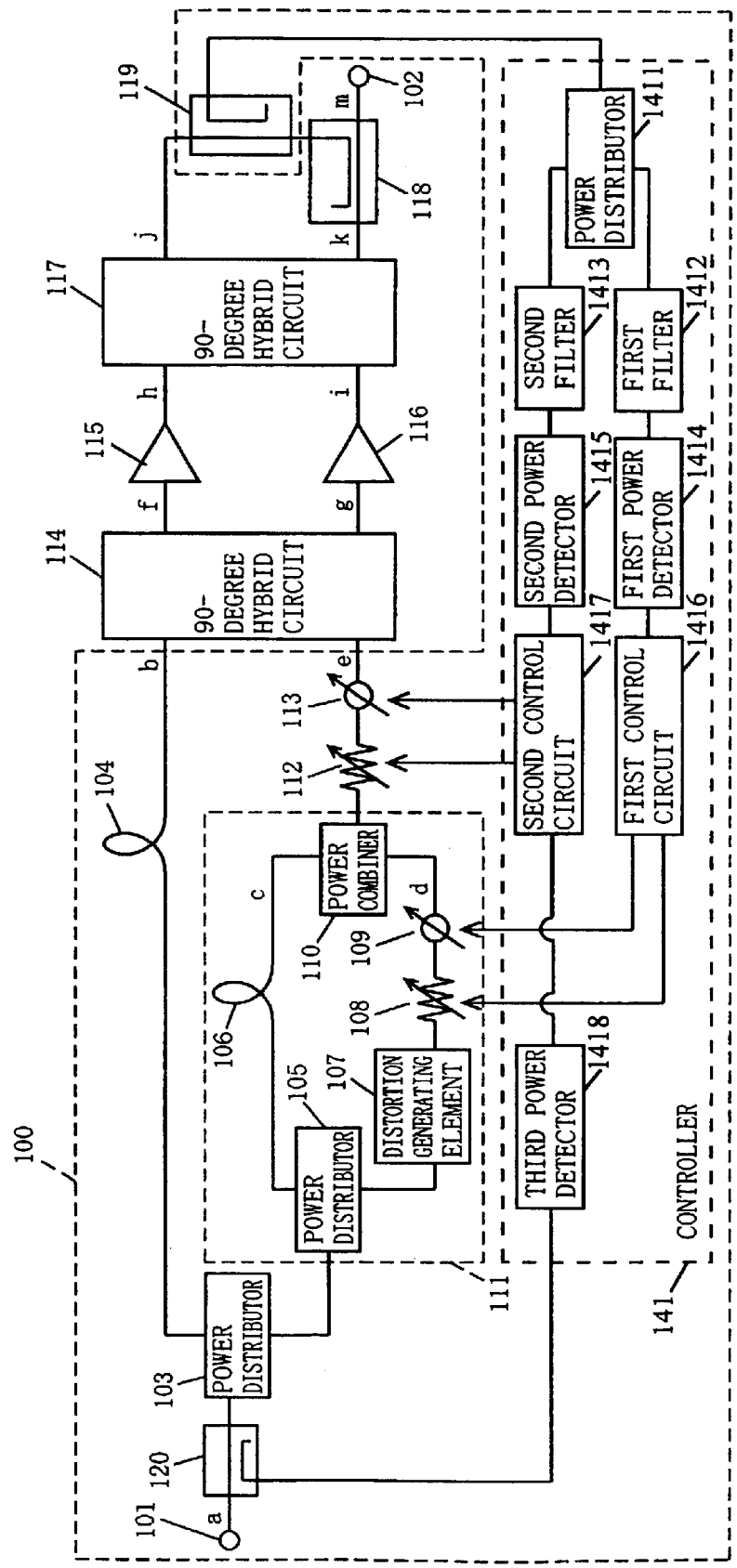
FIG. 1 is a block diagram illustrating the configuration of a distortion-compensated amplifying circuit according to a first embodiment of the present invention.

Preferred five embodiments of the present invention are described below with reference to the drawings. Throughout the embodiments and drawings, components similar in structure to each other are provided with the same reference numerals. Prior to detailed descriptions of the embodiments, an outline of each embodiment is now briefly described below.

First to fourth embodiments relate to distortion-compensated amplifying circuits, while a fifth embodiment relates to a feed-forward type amplifier using any of the amplifying circuits according to the first to fourth embodiments as a main amplifier. The relation among the first to fourth embodiments is as follows.

The first embodiment achieves a balanced type amplifying circuit having two amplifiers (115 and 116) placed in parallel between first and second 90-degree hybrid circuits (114 and 117). A first 90-degree hybrid circuit (114) is supplied with an original input signal including a carrier component and a distortion signal equal in amplitude and opposite in phase (that is, having a phase difference of 180 degrees) to distortion that occurs when the original signal is amplified by each of the amplifiers (115, 116). The first 90-degree hybrid circuit (114) then amplifies the original signal and the distortion signal so as to make these signals different in phase by 90 degrees. Thereafter, the amplified original signal and the distortion signal are forwarded from the second 90-degree hybrid circuit (117) to the directional coupler (118) for combining, thereby canceling distortion components included in both signals with each other (that is, carrying out a distortion suppressing process using the post-distortion technique).

In the second through fourth embodiments based on the first embodiment, a distortion-compensated amplifying circuit is constructed so that the original signal to be supplied to the first 90-degree hybrid circuit (114) is provided with distortion components. That is, the first 90-degree hybrid circuit (114) is provided with an original signal including distortion components as well as carrier components, and a distortion signal. With this, not only the distortion suppressing process using the post-distortion technique, but also a distortion suppressing process using the pre-distortion technique are carried out. A difference among the second through fourth embodiments is only in a circuit portion that generates the original signal including the above-mentioned carrier and distortion components and the distortion signal for input to the first 90-degree hybrid circuit (114). Such a circuit portion is called a signal input section (100).

(First Embodiment)

FIG. 1 is a block diagram illustrating the configuration of a distortion-compensated amplifying circuit according to the first embodiment of the present invention. In FIG. 1, the distortion-compensated amplifying circuit includes a signal input unit 100, an output terminal 102, 90-degree hybrid circuits 114 and 117, power amplifiers 115 and 116, and a directional coupler 118. The signal input unit 100 includes an input terminal 101, directional couplers 119 and 120, a power distributor 103, a distortion generating circuit 111, a variable attenuator 112, a phase changer 113, a delay circuit 104, and a controller 141.

The controller 141 includes a power distributor 1411, a first filter 1412, a second filter 1413, a first power detector 1414, a second power detector 1415, a first control circuit 1416, a second control circuit 1417, and a third power detector 1418.

The distortion generating circuit 111 includes a power distributor 105, a delay circuit 106, a distortion generating element 107, a variable attenuator 108, a phase changer 109, and a power combiner 110. The distortion generating circuit 111 generates a distortion signal including only a distortion component based on an original input signal including only a carrier component.

The distortion generating element 107, and the power amplifiers 115 and 116 can be each implemented by a transistor such as a field-effect transistor (FET). Transistors used as the power amplifiers 115 and 116 have the same characteristics to each other. The delay circuits 104 and 106 are each implemented by a coaxial cable such as a semi-rigid cable.

In FIG. 1, the input terminal 101 is connected to an input of the directional coupler 120. One output from the directional coupler 120 is coupled to an input of the power distributor 103. One output from the power distributor 103 is coupled to a first input terminal of the 90-degree hybrid circuit 114 via the delay circuit 104. The other output from the power distributor 103 is coupled to an input of the power distributor 105. One output from the power distributor 105 is coupled to one input to the power combiner 110 via the delay circuit 106. The other output from the power distributor 105 is coupled to the other input to the power combiner 110 via the distortion generating element 107, the variable attenuator 108, and the phase changer 109.

An output from the power combiner 110 is coupled to a second input terminal of the 90-degree hybrid circuit 114 via the variable attenuator 112 and the phase changer 113. A first output terminal of the 90-degree hybrid circuit 114 is connected to a first input terminal of the 90-degree hybrid circuit 117 via the power amplifier 115. A second output terminal of the 90-degree hybrid circuit 114 is connected to a second input terminal of the 90-degree hybrid circuit 117 via the power amplifier 116.

A first output terminal of the 90-degree hybrid circuit 117 is connected to a coupling terminal of the directional coupler 118 via the directional coupler 119. A second output terminal of the 90-degree hybrid circuit 117 is connected to the output terminal 102 via the directional coupler 118. A coupling terminal of the directional coupler 119 is connected to the power distributor 1411. One output terminal of the power distributor 1411 is connected to the first filter 1412, the first power detector 1414, and the first control circuit 1416. An output signal from the first control circuit 1416 is supplied to the variable attenuator 108 and the phase changer 109. The other terminal of the power distributor 1411 is connected to the second filter 1413, the second power detector 1415, and the second control circuit 1417. Furthermore, the second control circuit 1417 is connected to a coupling terminal of the directional coupler 120 via the third power detector 1418. An output signal from the second control circuit 1417 is supplied to the variable attenuator 112 and the phase changer 113.

The operation of the above-structured distortion-compensated amplifying circuit is described below by using FIGS. 1 through 6. FIGS. 2 through 6 show frequency spectra of signals and their phases at the terminals of the circuit of FIG. 1. Here, consider a case where two sine waves (carriers) having a frequency of f1 and a frequency of f2, respectively, are supplied to the input terminal 101. This terminal is hereinafter referred to as a terminal a, and a spectrum observed thereat is illustrated in FIG. 2A.

The signal supplied to the input terminal 101 is divided by the directional coupler 120 into two, for supply to the third power detector 1418 and the power distributor 103. One of the divided signals is supplied to the first input terminal of the 90-degree hybrid circuit 114 via the delay circuit 104. This first input terminal is hereinafter referred to as a terminal b, and a spectrum observed thereat is illustrated in FIG. 2B. The spectrum at the terminal b is similar to that at the terminal a, representing only carrier components having frequencies of f1 and f2.

The other output signal from the power distributor 103 is further divided by the power distributor 105 into two. One of the divided signals is supplied to one input terminal of the power combiner 110 via the delay circuit 106. This terminal is hereinafter referred to as a terminal c, and a spectrum observed thereat is illustrated in FIG. 2C. The spectrum at the terminal c is also similar to that at the terminal a, representing only carrier components having frequencies of f1 and f2.

The other output signal from the power distributor 105 is supplied to the distortion generating element 107, where intermodulation distortion (IM3) components of f3 and f4 are generated. The distortion generating element 107 outputs a signal including these IM3 components of f3 and f4. The output signal is adjusted in amplitude and phase by the variable attenuator 108 and the phase changer 109, and is then supplied to the other input terminal of the power combiner 110. This terminal is hereinafter referred to as a terminal d, and a spectrum observed thereat is illustrated in FIG. 2D. The variable attenuator 108 adjusts the amplitude based on a control voltage supplied from the first control circuit 1416. The phase changer 109 adjusts the phase based on a control voltage supplied from the first control circuit 1416. The operation of the first control circuit 1416 is described below in detail.

The first control circuit 1416 carries out an adjusting process so that the signals having the frequencies of f1 and f2 become equal in amplitude and opposite in phase to the signals of the frequencies of f1 and f2. Consequently, the power combiner 110 only outputs the IM3 components of f3 and f4, with the carrier components of f1 and f2 being suppressed. Such a signal is adjusted in amplitude by the variable attenuator 112 and in phase by the phase changer 113, and is then supplied to the second input terminal of the 90-degree hybrid circuit 114. This terminal is hereinafter referred to as a terminal e, and a spectrum observed thereat is illustrated in FIG. 2E. The variable attenuator 112 adjusts the amplitude based on a control voltage from the second control circuit 1417. The phase changer 113 changes the phase based on a control voltage from the second control circuit 1417. The operation of the second control circuit 1417 is described further below in detail. As such, only the IM3 components are supplied to the terminal e. Therefore, a portion surrounded by a dotted line 111 in FIG. 1 serves as a distortion generating circuit.

As illustrated in FIGS. 2B and 2E, assume herein that the phase of the carrier components of f1 and f2 supplied to the terminal b is 0 degree as a reference phase. Under this assumption, the second control circuit 1417 adjusts the phase changer 113 so that the phase of the IM3 components supplied to the terminal e becomes α+180 degrees. Here, α is a relative phase of the IM3 components of f3 and f4 with respect to the two sine waves (carriers) having the frequencies of f1 and f2 supplied to the power amplifier 115 (or 116). Here, the relative phase with respect to the carriers is defined as a phase of the IM3 components of f3 and f4 with respect to the carriers when these carriers of f1 and f2 instantaneously become in phase.

Figure 3A:
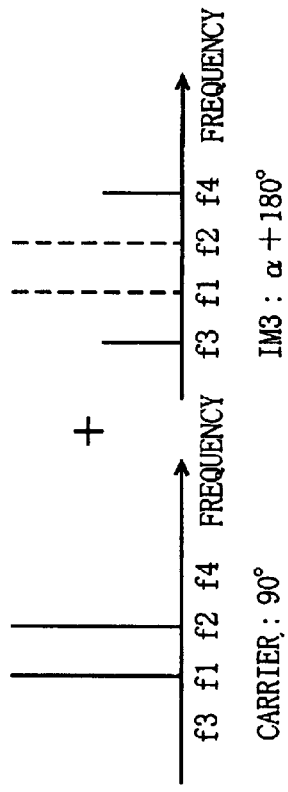
FIGS. 3A–3D are illustrations showing signal spectra at terminals f–i, respectively, of the distortion-compensated amplifying circuit according to the first embodiment of the present invention.
Figure 3B:
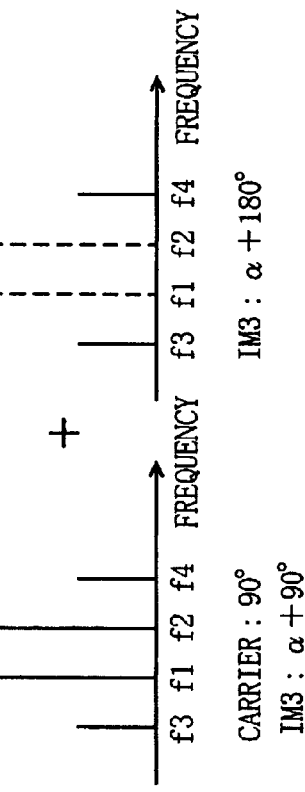

The signals supplied to the terminals b and e are forwarded to input terminals of the power amplifiers 115 and 116, respectively, via the 90-degree hybrid circuit 114. The input terminal of the power amplifier 115 is hereinafter referred to as a terminal f, while that of the power amplifier 116 is as a terminal g. The signal spectra and the carrier components, and the phase of the IM3 components at the terminals f and g are respectively illustrated in FIGS. 3A and 3B. As illustrated in FIG. 3A, what is observed at the terminal f is a composite signal including carrier components having a phase of 0 degree and IM3 components having a phase of α+270 degrees. On the other hand, as illustrated in FIG. 3B, what is observed at the terminal g is a composite signal including carrier components having a phase of 90 degrees and IM3 components having a phase of α+180 degrees.

Figure 3C:
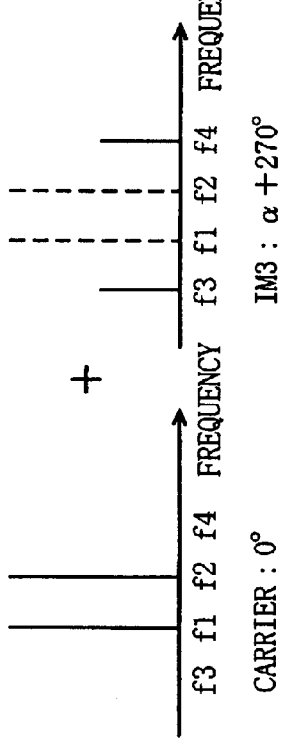

The signal supplied to the terminal f is amplified by the power amplifier 115 for output from its output terminal (this terminal is hereinafter referred to as a terminal h). The signal supplied to the terminal g is amplified by the power amplifier 116 for output from its output terminal (this terminal is hereinafter referred to as a terminal i) The signal spectra and the carrier components, and the phase of the IM3 components at the terminals h and i are respectively illustrated in FIGS. 3C and 3D. As illustrated in FIG. 3C, what is observed at the terminal h is a composite signal including carrier components having a phase of 0 degree, IM3 components having the phase of α that occur when the carrier components supplied to the power amplifier 115 are amplified, and the IM3 components having the phase of α+270 degrees supplied from the terminal f.

Figure 3D:
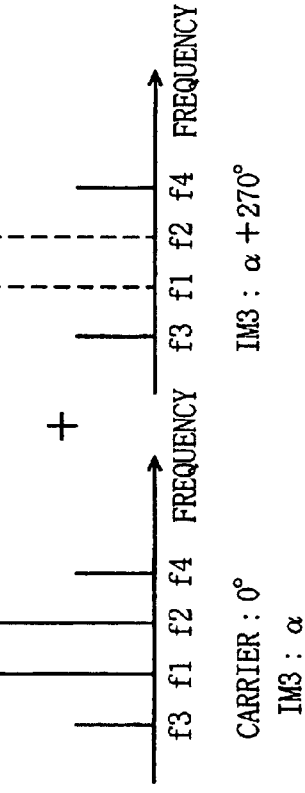

On the other hand, as illustrated in FIG. 3D, what is observed at the terminal i is a composite signal including carrier components having a phase of 90 degrees, the IM3 components having the phase of α+90 degrees that occur when the carrier components supplied to the power amplifier 116 are amplified, and the IM3 components having the phase of α+180 degrees supplied from the terminal g.

The signal at the terminal h is supplied to the first input terminal of the 90 degree hybrid circuit 117, while the signal at the terminal i is supplied to the second input terminal thereof. Consequently, as illustrated in FIG. 4, what is observed at the first output terminal of the 90-degree hybrid circuit 117 (this terminal is hereinafter referred to as a terminal j) is a composite signal including the signal at the terminal h and a signal delayed in phase by 90 degrees with respect to the signal at the terminal i. Therefore, carrier components are cancelled with each other, and only the IM3 components having the phase of α+270 degrees remain.

Figure 6:
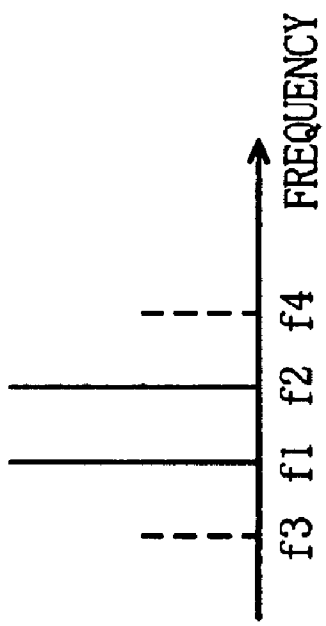
FIG. 6 is an illustration showing a signal spectrum at a terminal m of distortion-compensated amplifying circuits according to the first through fourth embodiments of the present invention.

On the other hand, as illustrated in FIG. 5, what is observed at the second output terminal of the 90-degree hybrid circuit 117 (this terminal is hereinafter referred to as a terminal k) is a composite signal including a signal delayed in phase by 90 degrees with respect to the signal at the terminal h and the signal at the terminal i. That is, only the carrier components having the phase of 90 degrees and the IM3 components having the phase of α+90 degrees are observed. The signals at the terminals j and k are combined by the directional coupler 118. Since the IM3 components of these signals have a phase difference of 180 degrees, those IM3 components are cancelled with each other at the directional coupler 118. As a result, to the output terminal 102 (this terminal is hereinafter referred to as a terminal m), only the carrier components are supplied, as illustrated in FIG. 6.

Part of the signal at the terminal j is extracted from the directional coupler 119, and is then supplied to the power distributor 1411. The power distributor 1411 divides the received signal into two for input to the first filter 1412 and the second filter 1413. The first filter 1412 passes only the carrier component having the frequency of f1 or f2 for supply to the first power detector 1414. The first power detector 1414 detects a power of the carrier components, and outputs a voltage corresponding to the detected power to the first control circuit 1416. The first control circuit 1416 outputs control voltages to control the variable attenuator 108 and the phase changer 109 so that the power of the carrier components detected by the first power detector 1414 becomes minimum.

The second filter 1413 passes only the IM3 component having the frequency of f3 or f4 for supply to the second power detector 1415. The second power detector 1415 detects a power of the IM3 components, and outputs a voltage corresponding to the detected power to the second control circuit 1417. Part of the signal at the terminal a is extracted by the directional coupler 120 for supply to the third power detector 1418. The third power detector 1418 detects a power of the carrier components, and outputs a voltage corresponding to the detected power to the second control circuit 1417. The second control circuit 1417 previously stores an optimal voltage level to be detected by the second power detector 1415 with respect to the power level detected by the third power detector 1418. By referring to the power level detected by the third power detector 1418, the second control circuit 1417 outputs control voltages to control the variable attenuator 112 and the phase changer 113 so that the power level detected by the second power detector 1415 becomes the optimal voltage level.

Figure 7:
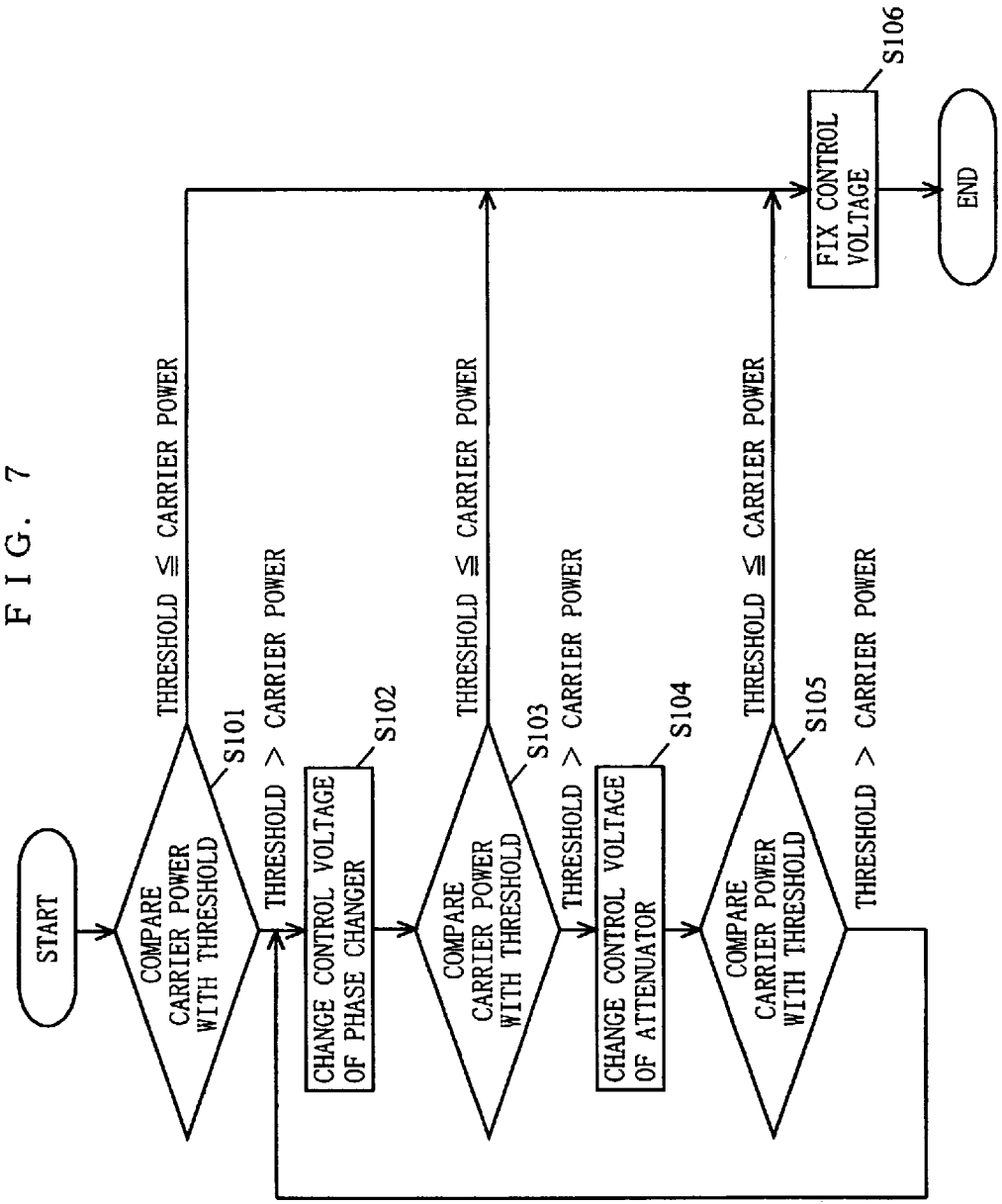
FIG. 7 is a flowchart showing one exemplary operation of a first control circuit 1416.
Figure 17:
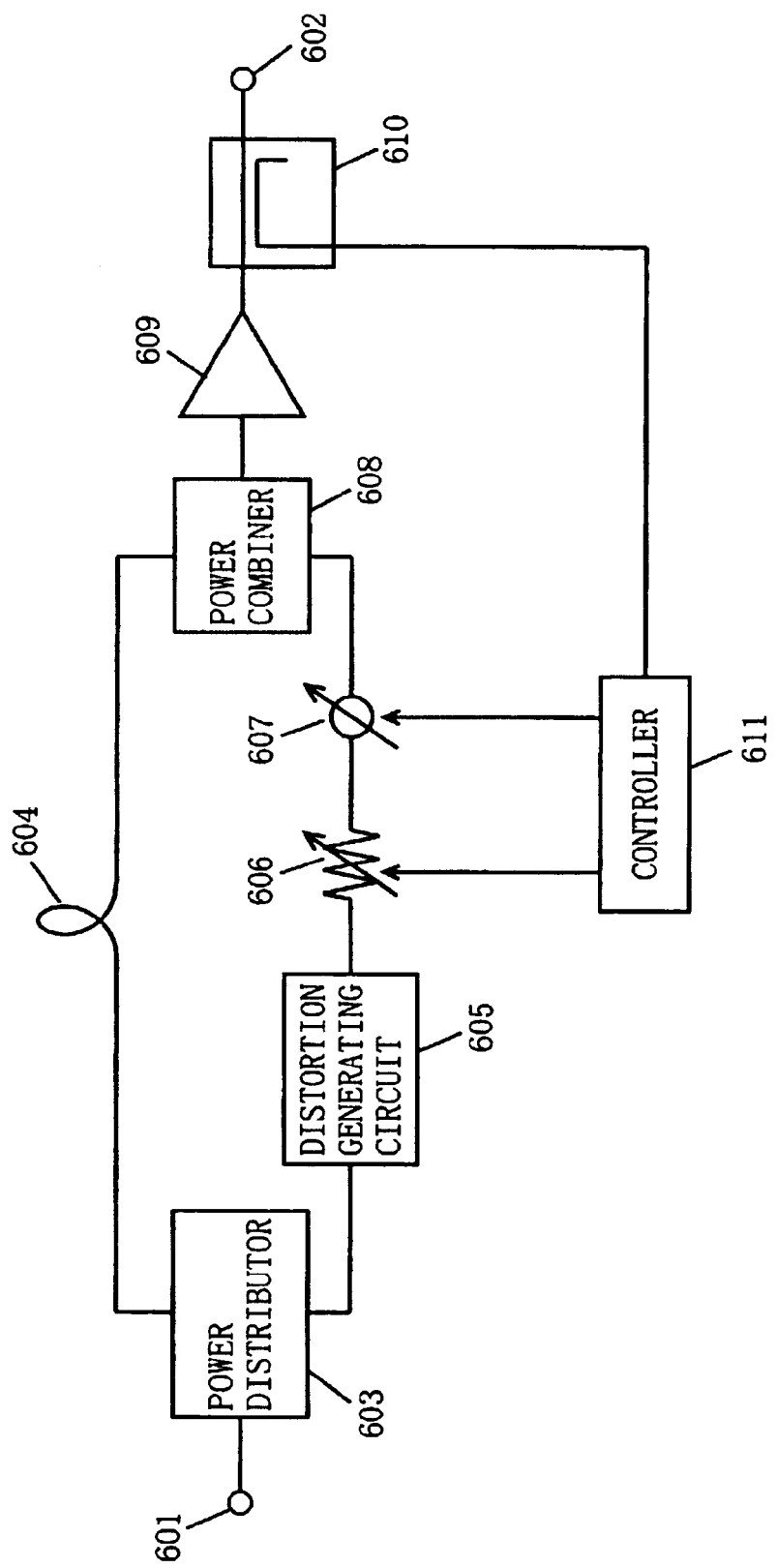
FIG. 17 is a block diagram illustrating one exemplary configuration of a conventional distortion-compensated amplifying circuit using the pre-distortion technique.

FIG. 7 is a flowchart showing one exemplary operation of the first control circuit 1416. With reference to FIG. 17, the operation of the first control circuit 1416 is described below. Assume herein that the first control circuit 1416 previously stores a threshold value of a power of the carrier components to be detected by the first power detector 1414 and initial values of the control voltages for controlling the variable attenuator 108 and the phase changer 109.

First, the first control circuit 1416 compares the power of the carrier components detected by the first power detector 1414 with the stored threshold value (step S101). If the power of the carrier components is equal to or larger than the threshold value, the procedure goes to step S106. If the power of the carrier components is smaller than the threshold value, the first control circuit 1416 changes the control voltage of the phase changer 109 in a predetermined direction (step S102), and then compares the power of the carrier components with the threshold value (step S103).

If the power of the carrier components is equal to or larger than the threshold value, the procedure goes to step S106. If the power of the carrier components is smaller than the threshold value, the first control circuit 1416 changes the control voltage of the variable attenuator 108 in a predetermined direction (step S104), and then further compares the power of the carrier components with the threshold value (step S105).

When the power of the carrier components is equal to or larger than the threshold value, the procedure goes to step S106. If the power of the carrier components is smaller than the threshold value, the procedure returns to step S102.

In step S106, the first control circuit 1416 does not change but fixes the control voltages of the variable attenuator 108 and the phase changer 109, and ends the procedure.

Next, the operation of the second control circuit 1417 is described below. The second control circuit 1417 first compares the power level of the distortion components detected by the second power detector 1415 with the power level of the carrier components detected by the third power detector 1418. The second control circuit 1417 previously stores an optimal power level of the distortion components to be detected by the second power detector 1415. In order to cause the second power detector 1415 to detect the stored optimal power level of the distortion components, the second control circuit 1417 outputs control voltages to control the variable attenuator 112 and the phase changer 113. A procedure for outputting such control voltages is similar to that of the first control circuit 1416 as shown in the flowchart of FIG. 7, except that, in steps S101, S103, and S105, the second control circuit 1417 compares the power level actually detected by the second power detector 1415 with the optimal power level of the distortion components.

As such, a loss occurring at the power combiner 608 in the background art as illustrated in FIG. 17 can be prevented. Therefore, an amplifier for compensating for the loss is not required, thereby achieving reduction in size and cost.

Figure 15:
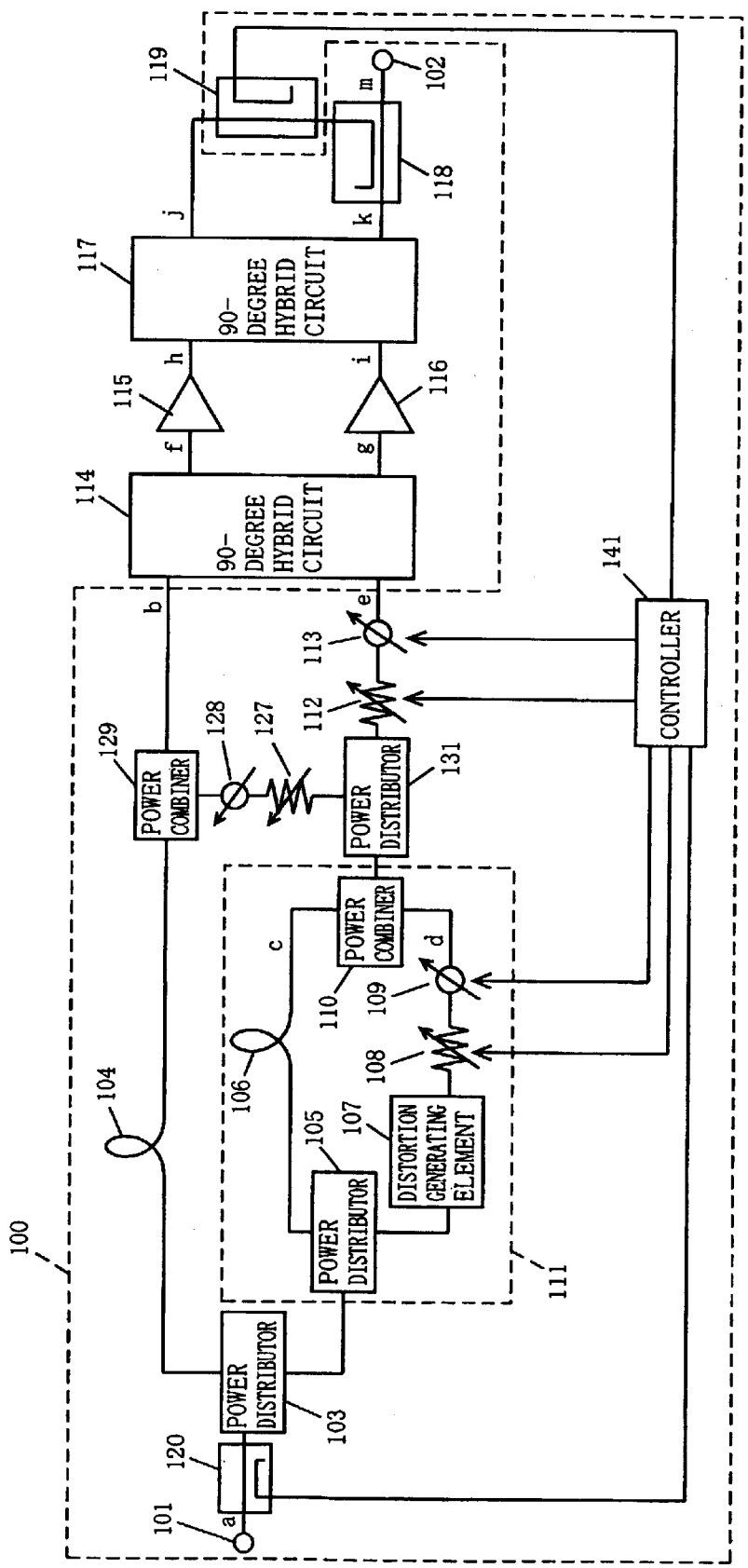
FIG. 15 is a block diagram illustrating the configuration of the distortion-compensated amplifying circuit according to the fourth embodiment of the present invention.

For example, consider a case where the output terminal 102 of FIG. 1 and the output terminal 602 of FIG. 17 output a power of Po [dBm]. In this case, when a gain of the power amplifiers 115 and 116 of FIG. 1 and the power amplifier 609 of FIG. 15 is taken as G [dB], and a ratio of power distribution between the power distributor of FIG. 1 and the power distributor 603 of FIG. 17 is taken as 1:1 (−3 dB each), a power supplied to the input terminal becomes Po−G+6 [dBm] in the background art, while a power supplied to the input terminal becomes Po−G+3 [dBm]. Therefore, the input power can be reduced by 3 dB.

Also, an amplifying operation is carried out with a phase difference of 90 degrees between the carrier components and the distribution components by using the 90-degree hybrid circuits. With this, it is possible to separately carry out amplification and suppression of the distortion components. Therefore, the amount of suppression of distortion can be increased, and the amplifying circuit can also be easily adjusted.

Also, in the present embodiment, the distortion-compensated amplifying circuit is structured so that the directional coupler 118 placed at the later stage of the power amplifiers performs a process of suppressing distortion. Therefore, only the distortion components can be easily extracted by the directional coupler 119 for use in controlling the amplifying circuit.

Note that, in the present embodiment, two power distributors 103 and 105 are used. Alternatively, a single three-division distributor can be used.

In the present embodiment, FETs are used for the distortion generating element 107 and the power amplifiers 115 and 116. Alternatively, bipolar transistors can be used as these components. Still alternatively, FETs can be used as the power amplifiers 115 and 116, while a diode can be used as the distortion generating element 107. In either case, the same effects as those in the present embodiment can be obtained.

In the present embodiment, coaxial cables, such as semi-rigid cables, are used for the delay circuits 104 and 106. Alternatively, other transmission lines, such as microstrips or delay filters, can be used. Still alternatively, not only delay circuits whose propagation delay time is fixed as used in the present embodiment, but also delay circuits whose propagation delay time is variable can be used, such as variable delay filters.

In the present embodiment, the variable attenuators 108 and 112 and the phase changers 109 and 113 are controlled by using the signal at the first output terminal (terminal j) of the 90-degree hybrid circuit 117. Alternatively, such control can be performed by using the signal to the input terminal 101 and the signal at the output terminal 102.

Figure 8:
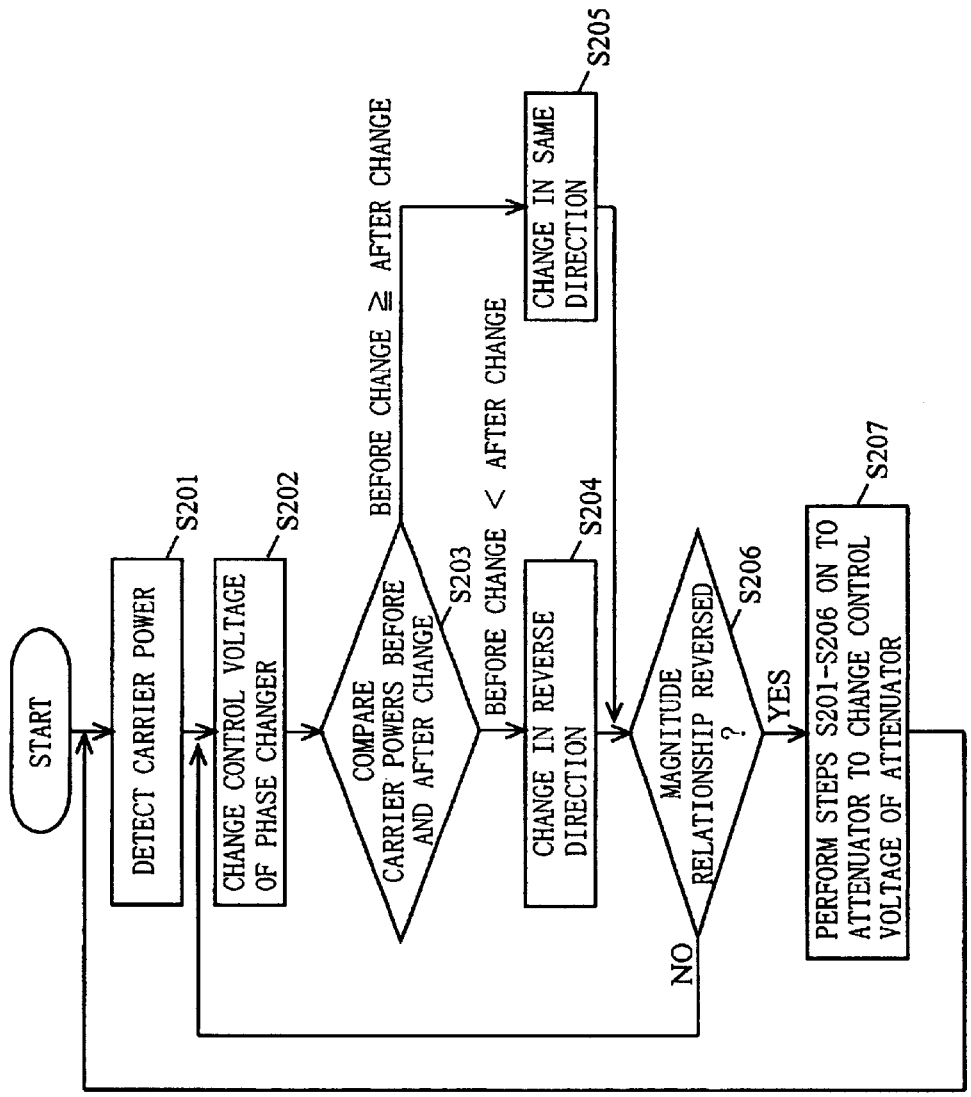
FIG. 8 is a flowchart showing another exemplary operation of the first control circuit 1416.

Note that the operation of the first control circuit 1416 is not restricted to the operation illustrated in FIG. 7. FIG. 8 is a flowchart showing another exemplary operation of the first control circuit 1416. With reference to FIG. 8, the other exemplary operation of the first control circuit 1416 is now described below. Assume herein that the first control circuit 1416 previously stores initial values of the control voltages for controlling the variable attenuator 108 and the phase changer 109.

The first control circuit 1416 first detects a voltage value corresponding to a carrier power from the first power detector 1414 (step S201). The first control circuit 1416 then changes the control voltage of the phase changer 109 in a predetermined direction (step S202), and then compares the carrier power before change and the carrier power after change with each other (step S203). If the carrier power before change is equal to or larger than that after change, the first control circuit 1416 changes the control voltage of the phase changer 109 in a direction opposite to the direction of change in step S201 (step S204), and then proceeds to step S206. If the carrier power before change is smaller than that after change, the first control circuit 1416 further changes the control voltage of the phase changer 109 in the same direction (step S205), and then proceeds to step S206.

In step S206, the first control circuit 1416 compares the carrier power before the control voltage is changed and the carrier power after the control voltage is changed to determine whether the relationship between their magnitudes has been reversed after the control voltage is changed. If the relationship has not been reversed, the procedure returns to step S202. If the relationship has been reversed, the first control circuit 1416 performs similar operations to those in steps S202 to S206 onto the variable attenuator 108 in order to change the control voltage of the variable attenuator 108 (step S207), and then returns to step S201. As such, a scheme of successively adjusting the control voltages can be taken without any threshold value.

(Second Embodiment)

Figure 9:
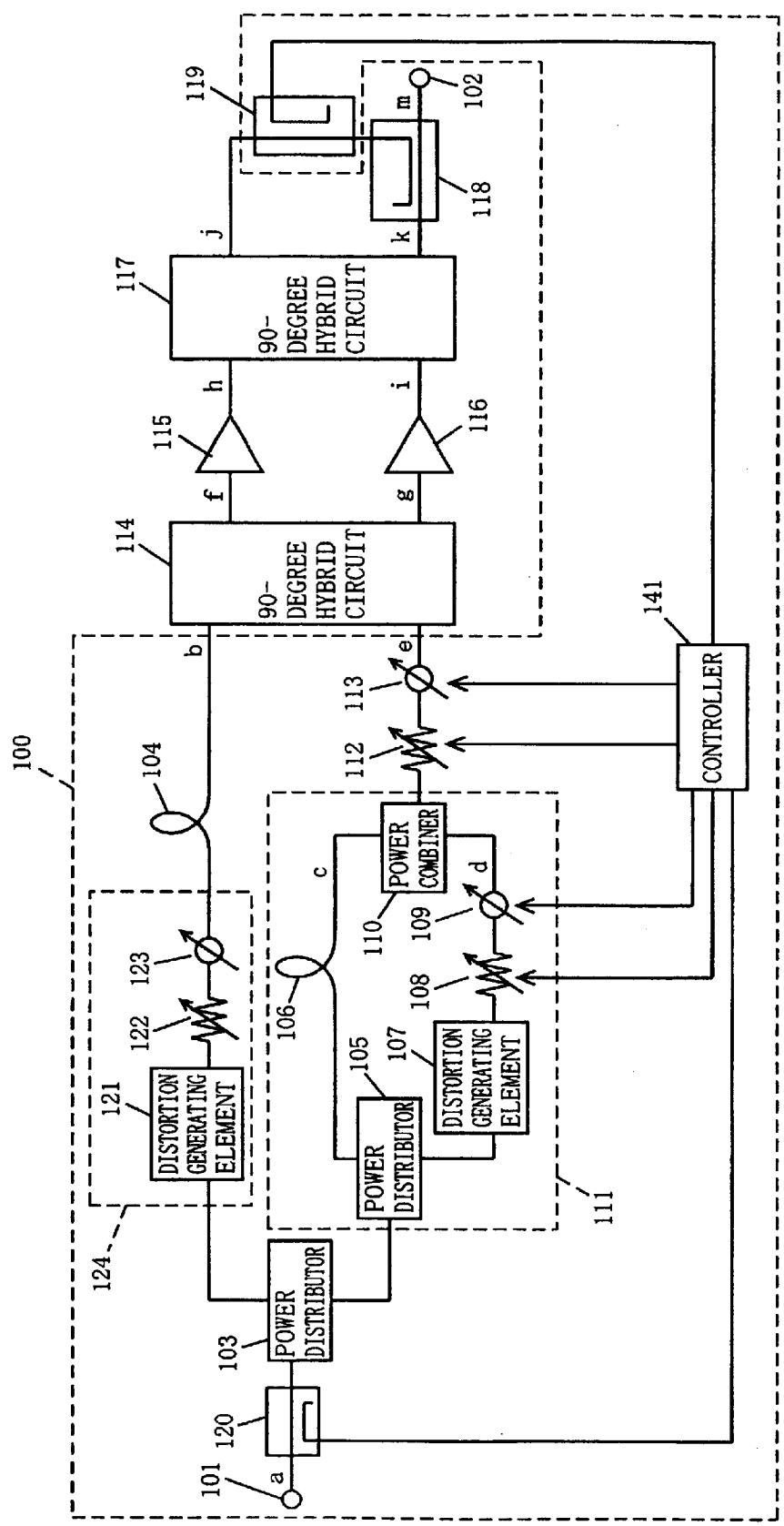
FIG. 9 is a block diagram illustrating the configuration of the distortion-compensated amplifying circuit according to the second embodiment of the present invention.

FIG. 9 is a block diagram illustrating the configuration of a distortion-compensated amplifying circuit according to the second embodiment of the present invention. In FIG. 9, components similar to those in the first embodiment are provided with the same reference numerals as those appearing in FIG. 1. Hereinafter, only differences from the first embodiment are described below.

In the first embodiment, one output of the power distributor 103 is supplied to the first input terminal (terminal b) of the 90-degree hybrid circuit 114 through the delay circuit 104. In the second embodiment, one output of the power distributor 103 is supplied to the distortion generating circuit 124. An output from the distortion generating circuit 124 is then supplied to the first input terminal (terminal b) of the 90-degree hybrid circuit 114 through the delay circuit 104.

Here, the distortion generating circuit 124 is structured by a distortion generating element 121, a variable attenuator 122, and a phase changer 123 that are connected in serial. The distortion generating element 121 is implemented by a transistor such as a field-effect transistor (FET). For example, when two sine waves (carriers) of f1 and f2 are supplied to the input terminal 101, these two carriers are supplied to the distortion generating element 121. Therefore, an output from the distortion generating element 121 includes IM3 components of f3 and f4 as well as f1 and f2.

That is, the distortion generating circuit 124 generates distortion components based on the original signal including carrier components, and then adds the generated distortion components to the original signal. Therefore, to the 90-degree hybrid circuit 114, the signal including the carrier components and the distortion components and the signal only including the distortion components are supplied.

FIGS. 6 and 10 through 13 illustrate a signal spectrum at each terminal (terminal a–k and m in FIG. 9). With reference to these drawings, the operation of the distortion-compensated amplifying circuit of the present invention is described below.

Signal spectra at the terminals a, c, d, and e as illustrated in FIGS. 10A, 10C, 10D, and 10E are similar to those in the first embodiment. However, a signal spectrum at the terminal b as illustrated in FIG. 10B includes the IM3 components of f3 and f4 as well as the carrier components of f1 and f2, which is different from the first embodiment. The phase of the IM3 components supplied to the terminal b becomes α+180 degrees when the phase of the carrier components of f1 and f2 (reference phase) is 0 degree. Assume herein that α is defined similarly to the case as described in the first embodiment. Note that the levels of the IM3 components supplied to the terminals d and e are different from the level of the IM3 components supplied to the terminal b. Therefore, the illustration is made so that the levels of the IM3 components illustrated in FIGS. 10D and 10E look different from those illustrated in FIG. 10B. The magnitudes of these levels are merely an example, and are not meant to be restrictive.

Signals at the terminal f and g as illustrated in FIGS. 11A and 11B include the carrier components and, as the IM3 components, components at the terminal b and components at the terminal e with a phase difference of 90 degrees. A signal at the terminal f is amplified by the power amplifier 115, and is then forwarded to the terminal h. At this time, the power amplifier 115 is supplied with the IM3 components having a phase opposite to the phase (α) of the IM3 components that occur when two sine waves (carriers) of f1 and f2 are supplied to the power amplifier 115. Therefore, at the power amplifier 115, a distortion suppressing effect of the pre-distortion technique is achieved. Consequently, the signal spectrum at the terminal h becomes, as illustrated in FIG. 11C, such that the IM3 components supplied at the phase of α+180 degrees are suppressed in level.

In practice, however, the IM3 components remain to a slight extent. For example, when the IM3 components that occur in the power amplifier 115 are larger in level than those supplied thereto, the IM3 components having a phase of α remain in the signal at the terminal h. Similar residual IM3 components are observed also at the terminal i, as illustrated in FIG. 11D.

Figure 13:
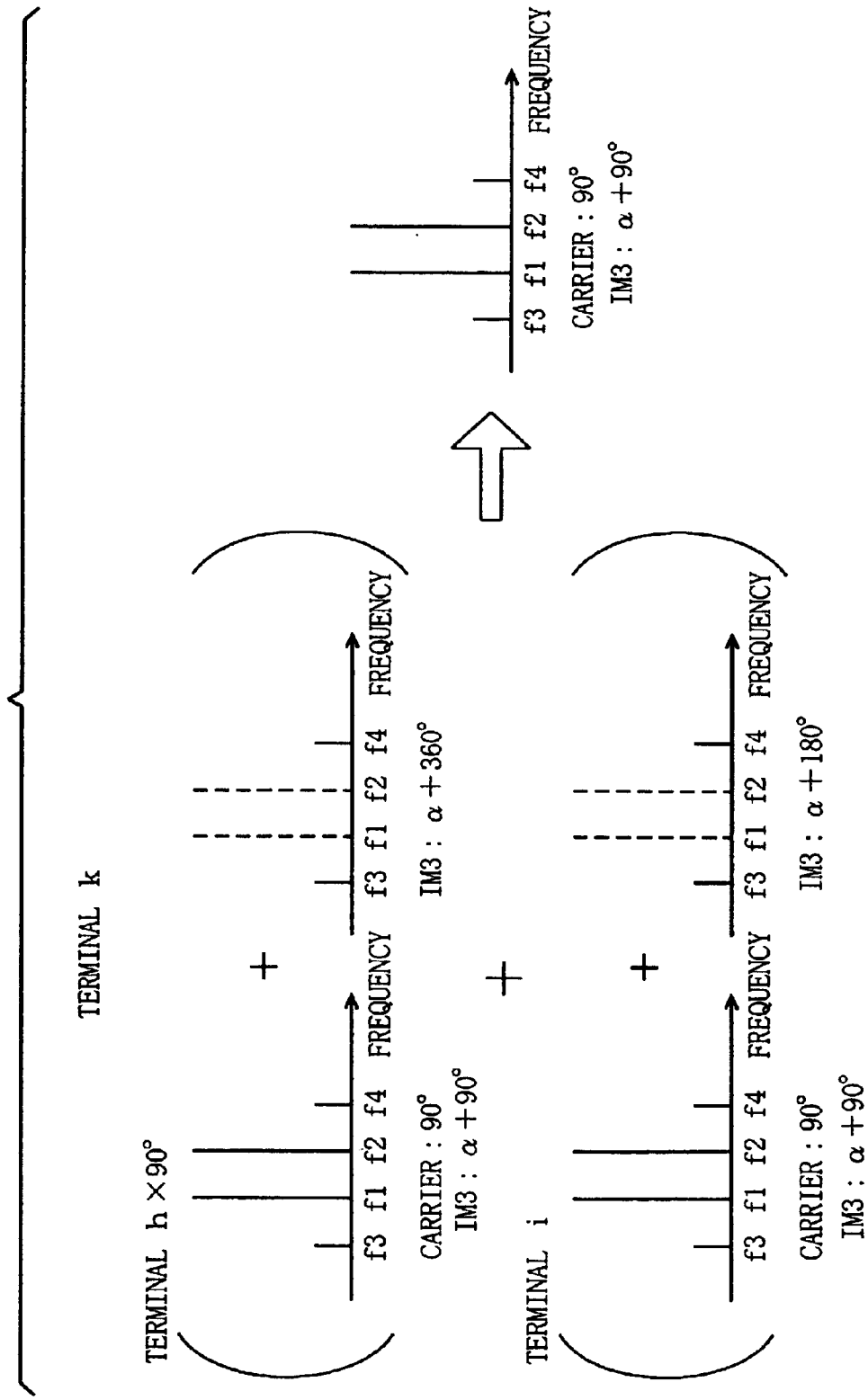
FIG. 13 is an illustration showing a signal spectrum at a terminal k of the distortion-compensated amplifying circuit according to the second embodiment of the present invention.

When the signals at the terminals h and i are supplied to the 90-degree hybrid circuit 117, only IM3 components having a phase of α+270 degrees are observed at the terminal j, as illustrated in FIG. 12. At the terminal k, as illustrated in FIG. 13, carrier components having a phase of 90 degrees and IM3 components having a phase of α+90 degrees are observed. Then, these signals at the terminals j and k are combined together by the directional coupler 118. At this time, the IM3 components included in both signals are cancelled with each other because their phase difference is 180 degrees. Consequently, as illustrated in FIG. 6, only the carrier components are outputted to the output terminal 102 (terminal m).

With the above-described configuration, in the second embodiment, the IM3 components occurring in the power amplifiers can be suppressed by using the pre-distortion technique of suppressing distortion at the power amplifiers and the post-distortion technique of suppressing distortion at the directional coupler 118. Thus, distortion can be suppressed more as a whole.

Also, with the combination of pre-distortion and post-distortion for suppressing distortion, the distortion components subjected to post-distortion (that is, the IM3 components to be generated by the distortion generating circuit 111) can be reduced in level, compared to the first embodiment where only post-distortion is performed for suppressing distortion. As a result, it is possible to obtain effects similar to those obtained when the amount of attenuation of the carrier components are reduced.

Furthermore, as with the first embodiment, the distortion-compensated amplifying circuit according to the second embodiment is structured so that the directional coupler 118 placed at the later stage of the power amplifiers performs a process of suppressing distortion. Therefore, only the distortion components can be easily extracted by the directional coupler 119 for use in controlling the amplifying circuit.

Also, as with the first embodiment, two power distributors 103 and 105 are used in the second embodiment. Alternatively, a single three-division distributor can be used.

Furthermore, as with the first embodiment, bipolar transistors can be used in the second embodiment as the distortion generating elements 107 and 121 and the power amplifiers 115 and 116. Also, a diode can be used as the distortion generating element 107.

Still further, as with the first embodiment, transmission lines other than coaxial cables, such as microstrips, or delay filters can be used in the second embodiment as the delay circuits 104 and 106. Also, not only delay circuits whose propagation delay time is fixed as used in the second embodiment, but also delay circuits whose propagation delay time is variable can be used, such as variable delay filters. Furthermore, although the delay circuit 104 is connected to the later stage of the distortion generating circuit 124 in the second embodiment, this connection order can be reversed or, in some cases, the delay circuit 104 can be omitted.

In the second embodiment, the variable attenuators 108 and 112 and the phase changers 109 and 113 are controlled by using the signal at the first output terminal (terminal j) of the 90-degree hybrid circuit 117 and the signal supplied to the input terminal 101. Alternatively, such control can be performed by using the signal supplied to the input terminal 101 and the signal at the output terminal 102. Also, in the second embodiment, the variable attenuators 108 and 112 and the phase changers 109 and 113 are controlled. Alternatively, the variable attenuator 122 and the phase changer 123 can be controlled.

(Third Embodiment)

Figure 14:
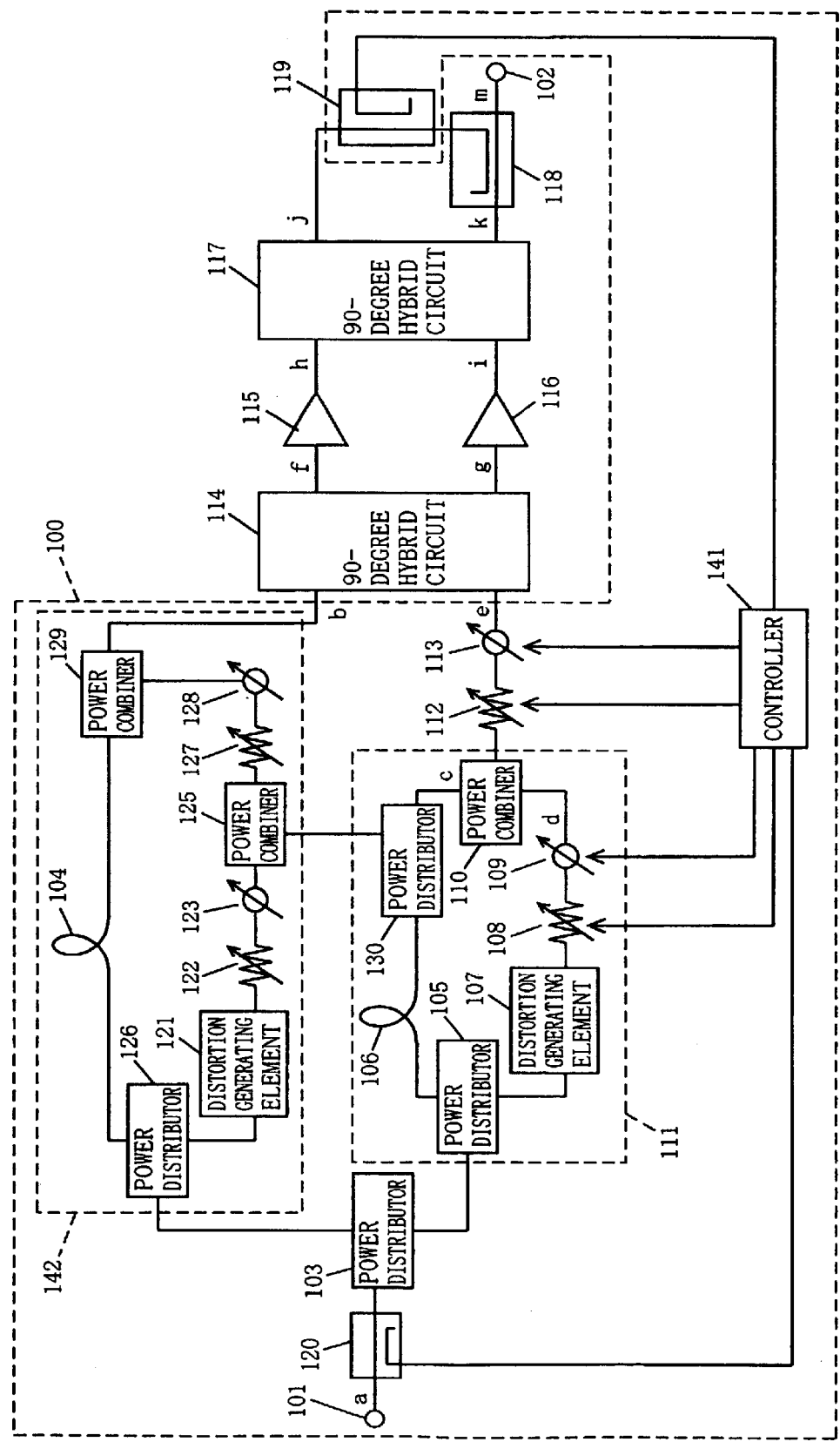
FIG. 14 is a block diagram illustrating the configuration of the distortion-compensated amplifying circuit according to the third embodiment of the present invention.

FIG. 14 is a block diagram illustrating the configuration of a distortion-compensated amplifying circuit according to the third embodiment of the present invention. In FIG. 14, components similar to those in the second embodiment are provided with the same reference numerals as those appearing in FIG. 9. The third embodiment is different from the second embodiment only in that a distortion generating circuit 142 is used which is different in internal structure from the distortion generating circuit 124 in order to generate a signal including both carrier and IM3 components at the terminal b.

The internal structure of the distortion generating circuit 142 is described below. The distortion generating circuit 142 includes a power distributor 126, the delay circuit 104, the distortion generating element 121, the variable attenuator 122, the phase changer 123, a power combiner 125, a variable attenuator 127, a phase changer 128, and a power combiner 129. The power distributor 126 distributes one of the signals distributed by the power distributor 103. The delay circuit 104 delays the signal distributed by the power distributor 126. The distortion generating element 121 receives the other signal distributed by the power distributor 126 to generate IM3 components. The variable attenuator 122 and the phase changer 123 change the amplitude and phase of the IM3 components generated by the distortion generating element 121 and the amplitude and phase of the carrier components. The power combiner 125 combines the output signal from the phase changer 123 and the output signal from a power distributor 130 together so that the carrier components of both signals become opposite in phase. The variable attenuator 127 and the phase changer 128 change the amplitude and phase of the output signal from the power combiner 125 (including only the IM3 components with the carrier components cancelled with each other). The power combiner 129 combines the IM3 components from the phase changer 128 and the carrier components from the delay circuit 104 together.

In the above-structured distortion generating circuit 142, the phase changer 128 is adjusted so that the phase difference between the carrier components and the IM3 components at the terminal b can be varied. Consequently, signal spectra observed at the terminals (a–k and m) illustrated in FIG. 14 become as illustrated in FIGS. 6 and 10 through 13, as with the second embodiment.

As such, with the use of the variable attenuator 127 and the phase changer 128, the phase difference between the carrier components and the IM3 components and the level at the terminal b can be arbitrarily varied. Therefore, it is possible to easily adjust the phases of the IM3 components at the terminals f and g supplied to the power amplifiers 115 and 116 from the terminal b (the phase of α+180 degrees illustrated in FIG. 11A and the phase of α+270 degrees illustrated in FIG. 11B, respectively) so as to become opposite to the phases of the IM3 components that occur in the power amplifiers 115 and 116, respectively. As a result, the amount of suppression of distortion by pre-distortion can be increased. Thus, the amount of suppression of distortion can be increased as a whole.

As with the first embodiment, the distortion compensated amplifying circuit according to the third embodiment is structured so that the directional coupler 118 placed at the later stage of the power amplifiers performs a process of suppressing distortion. Therefore, only the distortion components can be easily extracted by the directional coupler 119 for use in controlling the amplifying circuit.

Also, in the third embodiment, three two-division distributors 103, 105, and 126 are used. Alternatively, a single four-division distributor can be used. Still alternatively, a single three-division distributor and a single two-division distributor can be used.

Furthermore, as with the first embodiment, bipolar transistors can be used in the third embodiment as the distortion generating elements 107 and 121 and the power amplifiers 115 and 116. Also, diodes can be used as the distortion generating elements 107 and 121.

Still further, as with the first embodiment, transmission lines other than coaxial cables, such as microstrips, or delay filters can be used in the third embodiment as the delay circuits 104 and 106. Also, not only delay circuits whose propagation delay time is fixed as used in the third embodiment, but also delay circuits whose propagation delay time is variable can be used, such as variable delay filters.

In the third embodiment, the variable attenuators 108 and 112 and the phase changers 109 and 113 are controlled by using the signal at the first output terminal (terminal j) of the 90-degree hybrid circuit 117 and the signal supplied to the input terminal 101. Alternatively, such control can be performed by using the signal supplied to the input terminal 101 and the signal at the output terminal 102. Also, in the third embodiment, the variable attenuators 108 and 112 and the phase changers 109 and 113 are controlled. Alternatively, the variable attenuators 122 and 127 and the phase changers 123 and 128 can be controlled.

(Fourth Embodiment)

FIG. 15 is a block diagram illustrating the configuration of a distortion-compensated amplifying circuit according to the fourth embodiment of the present invention. In FIG. 15, components similar to those in the second embodiment are provided with the same reference numerals as those appearing in FIG. 9. The fourth embodiment is different from the second embodiment in that, in order to generate a composite signal including both carrier and IM3 components at the terminal b, the power combiner 129 combines the carrier components from the delay circuit 104 and the IM3 components that are supplied from one terminal of a power distributor 131 and are then changed in amplitude and phase by the variable attenuator 127 and the phase changer 128. With this, signal spectra at the terminals (a–k and m) become similar to those in the second or third embodiment, as illustrated in FIGS. 6 and 10 through 13.

As with the third embodiment, with the use of the variable attenuator 127 and the phase changer 128, the phase difference between the carrier components and the IM3 components and the level at the terminal b can be arbitrarily varied. Therefore, it is possible to easily adjust the phases of the IM3 components at the terminals f and g supplied to the power amplifiers 115 and 116 from the terminal b (the phase of α+180 degrees illustrated in FIG. 11A and the phase of α+270 degrees illustrated in FIG. 11B, respectively) so as to become opposite to the phases of the IM3 components that occur in the power amplifiers 115 and 116, respectively. As a result, the amount of suppression of distortion by pre-distortion can be increased. Thus, the amount of suppression of distortion can be increased as a whole. Furthermore, the number of components constructing the amplifying circuit can be reduced, compared with the third embodiment, thereby reducing the size of the amplifying circuit.

As with the first embodiment, the distortion-compensated amplifying circuit according to the fourth embodiment is structured so that the directional coupler 118 placed at the later stage of the power amplifiers performs a process of suppressing distortion. Therefore, only the distortion components can be easily extracted by the directional coupler 119 for use in controlling the amplifying circuit.

Also as with the first embodiment, two power distributors 103 and 105 are used in the fourth embodiment. Alternatively, a single three-division distributor can be used.

Furthermore, as with the first embodiment, bipolar transistors can be used in the fourth embodiment as the distortion generating elements 107 and 121 and the power amplifiers 115 and 116. Also, diodes can be used as the distortion generating elements 107 and 121.

Still further, as with the first embodiment, transmission lines other than coaxial cables, such as microstrips, or delay filters can be used in the fourth embodiment as the delay circuits 104 and 106. Also, not only delay circuits whose propagation delay time is fixed as used in the third embodiment, but also delay circuits whose propagation delay time is variable can be used, such as variable delay filters.

In the fourth embodiment, the variable attenuators 108 and 112 and the phase changers 109 and 113 are controlled by using the signal at the first output terminal (terminal j) of the 90-degree hybrid circuit 117 and the signal supplied to the input terminal 101. Alternatively, such control can be performed by using the signal supplied to the input terminal 101 and the signal at the output terminal 102. Also, in the fourth embodiment, the variable attenuators 108 and 112 and the phase changers 109 and 113 are controlled. Alternatively, the variable attenuator 127 and the phase changer 128 can be controlled.

(Fifth Embodiment)

Figure 16:
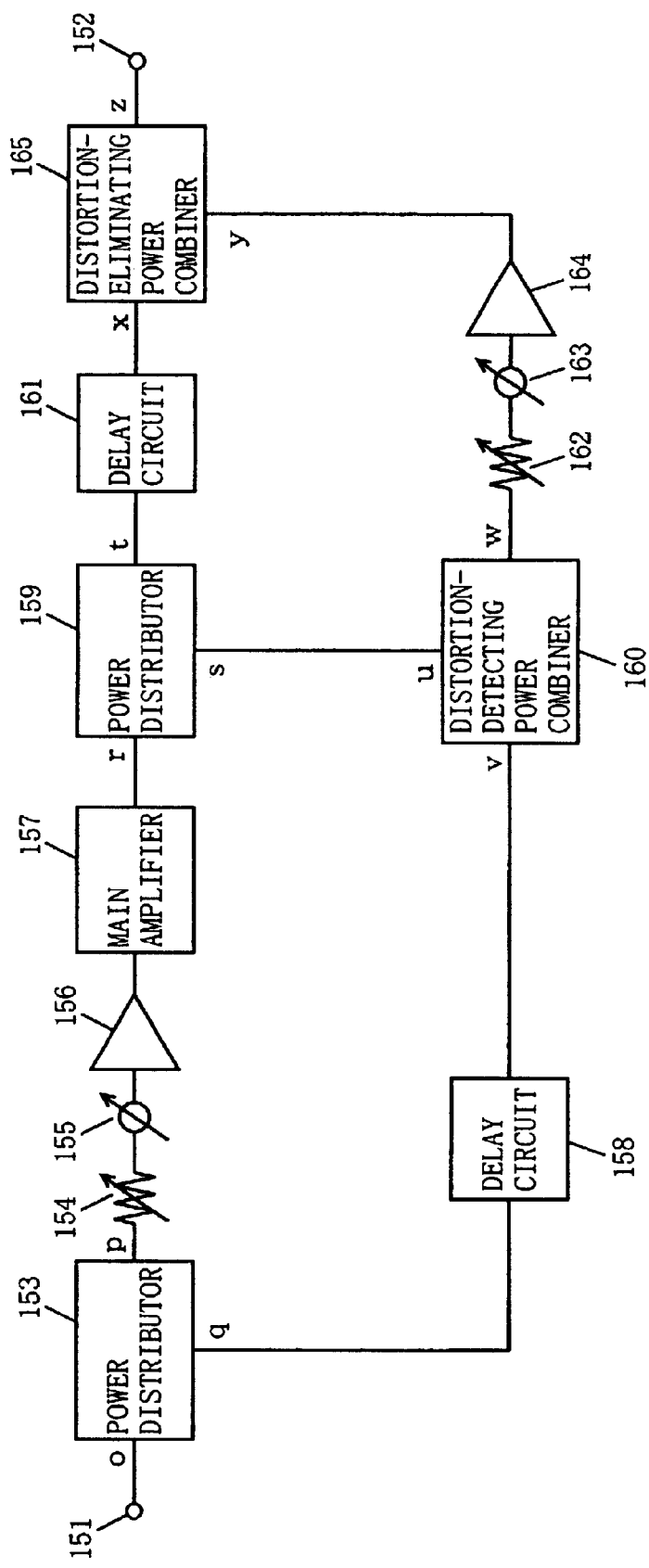
FIG. 16 is a block diagram illustrating the configuration of a distortion-compensated amplifying circuit according to a fifth embodiment of the present invention.

FIG. 16 is a block diagram illustrating the configuration of a feed-forward type distortion-compensated amplifying circuit according to the fifth embodiment of the present invention. In FIG. 16, an input terminal 151 is connected to a terminal o of the power distributor 153. A terminal p of the power distributor 153 is connected via a variable attenuator 154, a phase changer 155, and a driver amplifier 156 to a main amplifier 157. An output from the main amplifier 157 is supplied to a terminal r of the power distributor 159. A terminal s of the power distributor 159 is connected to a terminal u of a distortion-detecting power combiner 160. A terminal q of the power distributor 153 is connected to a terminal v of the distortion-detecting power combiner 160 via a delay circuit 158.

A terminal t of the power distributor 159 is connected to a terminal x of a distortion-eliminating power combiner 165 via a delay circuit 161. A terminal of the distortion-detecting power combiner 160 is connected via a variable attenuator 162 and a phase changer 163 to an auxiliary amplifier 164 for amplifying a distortion signal. An output from the auxiliary amplifier 164 is supplied to a terminal y of the distortion-eliminating power combiner 165. A terminal z of the distortion-eliminating power combiner 165 is connected to an output terminal 152. Here, the distortion-compensated amplifying circuit according to any of the first to fourth embodiments is used as the main amplifier 157.

The operation of the above-structured feed-forward type amplifier is described below. An input signal including multi-channel components supplied from the input terminal 151 is divided into two by the power distributor 153. One of the divided signals is forwarded from the terminal p to the variable attenuator 154, where the amplitude is adjusted, and then the phase changer 155, where the phase is adjusted. Then, the adjusted signal is amplified by the driver amplifier 156, and is then further amplified by the main amplifier 157.

Due to non-linearity of the main amplifier 157, the main amplifier 157 outputs a signal including distortion components due to intermodulation among multi-channel signals, as well as the input signal components. This signal is supplied to the terminal r of the power distributor 159, which distributes the signal to the terminals s and t. The signal to the terminal s is supplied to the terminal u of the distortion-detecting power combiner 160.

The other signal distributed from the power distributor 153 is supplied from the terminal q to the delay circuit 158 for delay, and is then supplied to the terminal v of the distortion-detecting power combiner 160. Here, the variable attenuator 154, the phase changer 155, and the delay circuit 158 are adjusted so that the input signal components included in the signals supplied to the terminals u and v become equal in amplitude and opposite in phase to each other. With this adjustment, the terminal w outputs a signal including only the distortion components with the input signal components being cancelled with each other.

Thereafter, the signal including only the distortion components outputted from the terminal w is adjusted in amplitude and phase by the variable attenuator 162 and the phase changer 163, respectively, and is then amplified by the auxiliary amplifier 164. At this time, the auxiliary amplifier 164 performs an amplifying process with sufficient back-off so as not to produce additional non-linear distortion. Therefore, the supplied distortion components themselves are amplified for output from the auxiliary amplifier 164. On the other hand, the signal including the distortion components outputted from the terminal t is delayed by the delay circuit 161, and is then supplied to the terminal x of the distortion-eliminating power combiner 165.

Here, the variable attenuator 162, the phase changer 163, and the delay circuit 161 are adjusted so that the distortion components included in the signals supplied to the terminals y and x become equal in amplitude and opposite in phase to each other. With this adjustment, the terminal z outputs a signal including only the input signal components with the distortion components cancelled with each other, to the output terminal 152.

An ideal feed-forward type amplifier could suppress all distortion components at the output terminal 152 irrespectively of distortion characteristics of the main amplifier 157. In practice, however, the amount of achievable suppression of distortion has a limit. In order to attain a possible largest amount of suppression of distortion, a delay time on a path from the terminal o to the terminal u should be made equal to a delay time on a path from the terminal o to the terminal v, and also the difference in amplitude and phase between signals passing through these paths should be minimized. Similarly, a delay time on a path from the terminal r to the terminal x should be made equal to a delay time on a path from the terminal r to the terminal y, and also the difference in amplitude and phase between signals passing through these paths should be minimized. Therefore, as the distortion components occurring at the main amplifier 157 are smaller, distortion can be reduced more as a whole.

To achieve the above, in the fifth embodiment, the distortion-compensated amplifying circuit according to any of the first through fourth embodiments is used as the main amplifier 157 to reduce the distortion occurring at the main distributor 157. Consequently, the feed-forward type amplifier of the fifth embodiment enables a large amount of suppression of distortion that is not achievable by conventional art.

While the invention has been described in detail, the foregoing description is in all aspects illustrative and not restrictive. It is understood that numerous other modifications and variations can be devised without departing from the scope of the invention.

What is claimed is:

1. A distortion-compensated amplifying circuit for amplifying a signal and compensating for distortion that occurs at a time of amplifying the signal, comprising:

two amplifying sections placed in parallel each for performing a signal amplifying process;

a first combining and distributing section supplied with an original signal including a carrier component and a first distortion signal having a frequency equal to a frequency of distortion that occurs when the original signal is amplified by each of the two amplifying sections, the first combining and distribution section for combining the original signal and the first distortion signal together and then distributing the combined signal into two signals for output to the two amplifying sections;

a second combining and distributing section for combining the two signals supplied from the two amplifying sections and then distributing the combined signal into two signals; and a combining section for combining the two signals supplied from the second combining and distributing section for output, wherein each of the first and second combining and distributing sections is a hybrid circuit that outputs two signals with a predetermined phase difference.

2. The distortion-compensated amplifying circuit according to claim 1, further comprising a signal input section for inputting the original signal and the first distortion signal to the first combining and distributing section.

3. The distortion-compensated amplifying circuit according to claim 2, wherein the signal input section includes a phase adjusting section for adjusting a phase of the original signal and/or a phase of the first distortion signal to be supplied to the first combining and distributing section.

4. The distortion-compensated amplifying circuit according to claim 3, wherein each of the first and second combining and distributing sections is a 90-degree hybrid circuit that outputs the two signals with a phase difference of 90 degrees, and the phase adjusting section adjusts the phase of the original signal and the phase of the first distortion signal so that the first distortion signal to be supplied to the first combining and distributing section has a phase difference of 180 degrees with respect to the distortion that occurs when the original signal is amplified by each of the amplifying sections.

5. The distortion-compensated amplifying circuit according to claim 4, wherein
the signal input section further includes an amplitude adjusting section for adjusting an amplitude of the first distortion signal to be supplied to the first combining and distributing section.

6. The distortion-compensated amplifying circuit according to claim 5, wherein
the amplitude adjusting section adjusts the amplitude of the first distortion signal to become equal to an amplitude of the distortion that occurs when the original signal is amplified by each of the amplifying sections.

7. The distortion-compensated amplifying circuit according to claim 6, wherein
the second combining and distributing section outputs
a signal only including a distortion component delayed in phase by 90 degrees with respect to the first distortion signal supplied to the first combining and distributing section; and
a signal including a carrier component delayed in phase by 90 degrees with respect to the original signal supplied to the first combining and distributing section, and a distortion component advanced in phase by 90 degrees with respect to the first distribution signal supplied to the first combining and distributing section, and
the signal input section further includes a control section for controlling the phase adjusting section and the amplitude adjusting section based on a power of the signal including only the distortion component.

8. The distortion-compensated amplifying circuit according to claim 2, wherein
the signal input section includes
a distributing section for distributing the original signal into two signals; and
a first distortion generating section for generating the first distortion signal based on one of the two signals distributed by the distributing section.

9. The distortion-compensated amplifying circuit according to claim 2, wherein
the signal input section includes a distortion adding section for adding, to the original signal, a second distortion component having a frequency equal to a frequency of the distortion that occurs when the original signal is amplified by each of the amplifying sections.

10. The distortion-compensated amplifying circuit according to claim 9, wherein
the signal input section further includes a phase adjusting section for adjusting a phase of the original signal added with the second distortion component and/or a phase of the first distortion signal to be supplied to the first combining and distributing section.

11. The distortion-compensated amplifying circuit according to claim 10, wherein
each of the first and second combining and distributing sections is a 90-degree hybrid circuit that outputs the two signals with a phase difference of 90 degrees, and
the phase adjusting section adjusts the phase of the first distortion signal and the phase of the original signal so that the first distortion signal to be supplied to the first combining and distributing section has a phase difference of 180 degrees with respect to the distortion that occurs when the original signal added with the second distortion component is amplified by each of the amplifying sections.

12. The distortion-compensated amplifying circuit according to claim 10, wherein
the signal input section further includes an amplitude adjusting section for adjusting an amplitude of the first distortion signal to be supplied to the first combining and distributing section.

13. The distortion-compensated amplifying circuit according to claim 12, wherein
the amplitude adjusting section adjusts the amplitude of the first distortion signal to become equal to an amplitude of the distortion that occurs when the original signal added with the second distortion component is amplified by each of the amplifying sections.

14. The distortion-compensated amplifying circuit according to claim 13, wherein
the second combining and distributing section outputs
a signal only including a distortion component delayed in phase by 90 degrees with respect to the first distortion signal supplied to the first combining and distributing section; and
a signal including a carrier component delayed in phase by 90 degrees with respect to the original signal supplied to the first combining and distributing section, and a distortion component advanced in phase by 90 degrees with respect to the first distribution signal supplied to the first combining and distributing section, and
the signal input section further includes a control section for controlling the phase adjusting section and the amplitude adjusting section based on a power of the signal including only the distortion component.

15. The distortion-compensated amplifying circuit according to claim 9, wherein
the signal input section further includes an amplitude adjusting section for adjusting an amplitude of the first distortion signal to be supplied to the first combining and distributing section.

16. The distortion-compensated amplifying circuit according to claim 15, wherein
the amplitude adjusting section adjusts the amplitude of the first distortion signal to become equal to an amplitude of the distortion that occurs when the original signal is amplified by each of the amplifying sections.

17. The distortion-compensated amplifying circuit according to claim 16, wherein
the second combining and distributing section outputs
a signal only including a distortion component delayed in phase by 90 degrees with respect to the first distortion signal supplied to the first combining and distributing section; and
a signal including a carrier component delayed in phase by 90 degrees with respect to the original signal supplied to the first combining and distributing section, and a distortion component advanced in phase by 90 degrees with respect to the first distribution signal supplied to the first combining and distributing section, and
the signal input section further includes a control section for controlling the phase adjusting section and the amplitude adjusting section based on a power of the signal including only the distortion component.

18. The distortion-compensated amplifying circuit according to claim 9, wherein
the signal input section further includes a distributing section for distributing the original signal into two signals; and a first distortion generating section for generating the first distortion signal based on one of the two signals distributed by the distributing section, and the distortion adding section generates the second distortion component based on another of the two signals distributed by the distributing section, and adds the generated second distortion component to the other of the two signals.

19. The distortion-compensated amplifying circuit according to claim 9, wherein the signal input section further includes:

a first distributing section for distributing the original signal into two signals;

a first distortion generating section for generating the first distortion signal based on one of the two signals distributed by the first distributing section from the original signal; and a second distributing section for distributing the first distortion signal generated by the first distortion generating section into two signals, and the distortion adding section adds, as the second distribution component, one of the two signals distributed by the second distributing section from the first distortion signal to another of the two signals distributed by the first distributing section from the original signal.

20. A distortion-compensated amplifying circuit, comprising:

a first power distributing section for distributing an input signal into two signals;

a first propagation time delaying section for adjusting a propagation delay time of one of the two signals distributed by the first power distributing section;

a second power distributing section for distributing another of the two signals distributed by the first power distributing section in two signals, a second propagation time adjusting section for adjusting a propagation delay time of one of the two signals distributed by the second power distributing section;

a distortion generating section supplied with another of the two signals distributed by the second power distributing section to generate a distortion signal;

a first vector adjusting section for adjusting an amplitude and a phase of an output signal from the distortion generating section;

a first power combining section for combining an output signal from the second propagation time delaying section and an output signal from the first vector adjusting section;

a second vector adjusting section for adjusting an amplitude and a phase of an output signal from the first power combining section;

a first power combining and distributing section for combining an output signal from the first propagation time delaying section and an output signal from the second vector adjusting section, and distributing the combined signal into two signals;

two power amplifying sections each for amplifying the two signals distributed by the first power combining and distributing section;

a second power combining and distributing section for combining the amplified two signals, and distributing the combined and amplified two signals into two signals; and a second power combining section for combining the two signals distributed by the second power combining and distributing section, wherein each of the first and second power combining and distributing sections is a 90-degree hybrid circuit, and at least one of the first and second vector adjusting sections adjusts the amplitude and the phase of the signals so that a distortion component included in a signal from the second vector adjusting section to the first power combining and distributing section becomes equal in amplitude and opposite in phase to distortion that occurs when the two signals are amplified by the power amplifying sections.

21. The distortion-compensated amplifying circuit according to claim 20, further comprising a control section for detecting one of the two signals distributed by the second power combining and distributing section and, based on the detection result, controlling the first and second vector adjusting sections.

22. A distortion-compensated amplifying circuit, comprising:

a first power distributing section for distributing an input signal into two signals;

a first distortion generating section supplied with one of the two signals distributed by the first power distributing section for generating a distortion signal;

a first vector adjusting section for adjusting an amplitude and a phase of an output signal from the first distortion generating section;

a first propagation time delaying section for adjusting a propagation delay time of an output signal from the first vector adjusting section;

a second power distributing section for distributing another signal distributed by the first power distributing section into two signals;

a second propagation time delaying section for adjusting a propagation delay time of one of the two signals distributed by the second power distributing section;

a second distortion generating section for generating a distortion signal supplied with another of the two signals distributed by the second power distributing section;

a second vector adjusting section for adjusting an amplitude and a phase of an output signal from the second distortion generating section;

a first power combining section for combining an output signal from the second propagation time delaying section and an output signal from the second vector adjusting section;

a third vector adjusting section for adjusting an amplitude and a phase of an output signal from the first power combining section;

a first power combining and distributing section for combining an output signal from the first propagation time delaying section and an output signal from the third vector adjusting section, and distributing the combined signal into two signals;

two power amplifying sections each for amplifying the two signals distributed by the first power combining and distributing section;

a second power combining and distributing section for combining the amplified two signals, and distributing the combined and amplified two signals into two signals; and a second power combining section for combining the two signals distributed by the second power combining and distributing section, wherein each of the first and second power combining and distributing sections is a 90-degree hybrid circuit, the first vector adjusting section adjusts the amplitude and the phase of the output signal from the first distortion generating section so that a first distortion component included in a signal from the first propagation time delaying section to the first power combining and distributing section becomes equal in amplitude and opposite in phase to distortion that occurs when the signals are amplified by the power amplifying sections, and at least one of the second and third vector adjusting sections adjusts the amplitude and the phase of the output signal so that a second distortion component included in a signal from the third adjusting section to the first power combining and distributing section becomes equal in amplitude and opposite in phase to distortion that occurs when the signals including the first distortion component are amplified by the power amplifying sections.

23. The distortion-compensated amplifying circuit according to claim 22, further comprising a control section for detecting one of the two signals from the second power combining and distributing section and, based on the detection result, controlling the first, second, and third vector adjusting sections.

24. A distortion-compensated amplifying circuit, comprising:

a first power distributing section for distributing an input signal into two signals;

a second power distributing section for distributing one of the two signals distributed by the first power distributing section into two signals;

a first propagation time delaying section for adjusting a propagation delay time of one of the two signals distributed by the second power distributing section;

a first distortion generating section supplied with another of the two signals distributed by the second power distributing section for generating a distortion signal a first vector adjusting section for adjusting an amplitude and a phase of an output signal from the first distortion generating section;

a third power distributing section for distributing another of the two signals distributed by the first power distributing section into two signals;

a second propagation time delaying section for adjusting a propagation delay time of one of the two signals distributed by the third power distributing section;

a fourth power distributing section for distributing an output signal from the second propagation time delaying section into two signals;

a second distortion generating section supplied with another of the two signals distributed by the third power distributing section for generating a distortion signal;

a second vector adjusting section for adjusting an amplitude and a phase of an output signal from the second distortion generating section;

a first power combining section for combining one of the two signals distributed by the fourth power distributing section and an output signal from the first vector adjusting section;

a third vector adjusting section for adjusting an amplitude and a phase of an output signal from the first power combining section;

a second power combining section for combining an output signal from the first propagation time delaying section and an output signal from the third vector adjusting section;

a third power combining section for combining another of the two signals distributed by the fourth power distributing section and an output signal from the second vector adjusting section;

a fourth vector adjusting section for adjusting an amplitude and a phase of an output signal from the third power combining section;

a first power combining and distributing section for combining an output signal from the second power combining section and an output signal from the fourth vector adjusting section, and distributing the combined signal into two signals;

two power amplifying sections each for amplifying the two signals distributed by the first power combining and distributing section;

a second power combining and distributing section for combining the amplified two signals, and distributing the combined and amplified two signals into two signals; and a second power combining section for combining the two signals distributed by the second power combining and distributing section, wherein each of the first and second power combining and distributing sections is a 90-degree hybrid circuit, at least one of the first and third vector adjusting sections adjusts the amplitude and the phase of the output signal so that a first distortion component included in a signal from the second power combining section to the first power combining and distributing section becomes equal in amplitude and opposite in phase to distortion that occurs when the signals are amplified by the power amplifying sections, and at least one of the second and fourth vector adjusting sections adjusts the amplitude and the phase of the output signal so that a second distortion component included in a signal from the fourth vector adjusting section to the first power combining and distributing section becomes equal in amplitude and opposite in phase to distortion that occurs when the signals including the first distortion component are amplified by the power amplifying sections.

25. The distortion-compensated amplifying circuit according to claim 24, further comprising a control section for detecting one of the two signals from the second power combining and distributing section and, based on the detection result, controlling the first, second, third, and fourth vector adjusting sections.

26. A distortion-compensated amplifying circuit, comprising:

a first power distributing section for distributing an input signal into two signals;

a first propagation time delaying section for adjusting a propagation delay time of one of the two signals distributed by the first power distributing section;

a second power distributing section for distributing another of the two signals distributed by the first power distributing section into two signals;

a second propagation time delaying section for adjusting a propagation delay time of one of the two signals distributed by the second power distributing section;

a distortion generating section supplied with another of the two signals distributed by the second power distributing section for generating a distortion signal;

a first vector adjusting section for adjusting an amplitude and a phase of an output signal from the distortion generating section;

a first power combining section for combining an output signal from the second propagation time delaying section and an output signal from the first vector adjusting section;

a third power distributing section for distributing an output signal from the first power combining section into two signals;

a second vector adjusting section for adjusting an amplitude and a phase of one of the two signals distributed by the third power distributing section;

a second power combining section for combining an output signal from the first propagation time delaying section and an output signal from the second vector adjusting section;

a third vector adjusting section for adjusting a phase and an amplitude of another of the two signals distributed by the third power distributing section;

a first power combining and distributing section for combining an output signal from the second power combining section and an output signal from the third vector adjusting section, and distributing the combined signal into two signals;

two power amplifying sections for amplifying the two signals distributed by the first power combining and distributing section;

a second power combining and distributing section for combining the amplified two signals, and distributing the combined and amplified two signals into two signals; and a second power combining section for combining the two signals distributed by the second power combining and distributing section, wherein each of the first and second power combining and distributing sections is a 90-degree hybrid circuit, the third vector adjusting section adjusts the amplitude and the phase of the output signal so that a first distortion component included in a signal from the second power combining section to the first power combining and distributing section becomes equal in amplitude and opposite in phase to distortion that occurs when the signals are amplified by the power amplifying sections, and at least one of the first and second vector adjusting sections adjusts the amplitude and the phase of the output signal so that a second distortion component included in a signal from the second vector adjusting section to the first power combining and distributing section becomes equal in amplitude and opposite in phase to distortion that occurs when the signals including the first distortion component are amplified by the power amplifying sections.

27. The distortion-compensated amplifying circuit according to claim 26, further comprising a control section for detecting one of the two signals from the second power combining and distributing section and, based on the detection result, controlling the first, second, and third vector adjusting sections.

28. A feed-forward type amplifying circuit, comprising:

a first power distributor for distributing an input signal into two signals;

a first vector adjusting circuit for adjusting an amplitude and a phase of one of the two signals distributed by the first power distributor;

a main amplifier for amplifying an output signal from the first vector adjusting circuit;

a second power distributor for distributing an output signal from the main amplifier into two signals:

a first delay circuit for delaying a phase of another of the two signals distributed by the first power distributor;

a distortion-detecting power combiner for combining an output signal from the first delay circuit and one of the two signals distributed by the second power distributor;

a second vector adjusting circuit for adjusting an amplitude and a phase of an output signal from the distortion-detecting power combiner;

an auxiliary amplifier for amplifying an output signal from the second vector adjusting circuit;

a second delay circuit for delaying another of the two signals distributed by the second power distributor; and a distortion-eliminating power combiner for combining an output signal from the auxiliary amplifier and an output signal from the second delay circuit, the main amplifier including:

a first power distributing section for distributing an input signal into two signals;

a first propagation time delaying section for adjusting a propagation delay time of one of the two signals distributed by the first power distributing section;

a second power distributing section for distributing another of the two signals distributed by the first power distributing section into two signals;

a second propagation time delaying section for adjusting a propagation delay time of one of the two signals distributed by the second power distributing section;

a distortion generating section supplied with another of the two signals distributed by the second power distributing section for generating a distortion signal;

a first vector adjusting section for adjusting an amplitude and a phase of an output signal from the distortion generating section;

a first power combining and distributing section for combining an output signal from the second propagation time delaying section and an output signal from the first vector adjusting section, and distributing the combined signal into two signals;

a second vector adjusting section for adjusting an amplitude and a phase of an output signal from the first power combining section;

a first power combining section for combining an output signal from the first propagation time delaying section and an output signal from the first vector adjusting section;

a second vector adjusting section for adjusting an amplitude and a phase of an output signal from the first power combining section;

a first power combining and distributing section for combining an output signal from the first propagation time delaying section and an output signal from the second vector adjusting section, and distributing the combined signal into two signals;

two power amplifying sections for amplifying the two signals distributed by the first power combining and distributing section;

a second power combining and distributing section for combining the amplified two signals, and distributing the combined and amplified two signals into two signals; and a second power combining section for combining the two signals distributed by the second power combining and distributing section, wherein each of the first and second power combining and distributing sections is a 90-degree hybrid circuit, and at least one of the first and second vector adjusting sections adjusts the amplitude and the phase of the output signal so that a distortion component included in a signal from the second vector adjusting section to the first power combining and distributing section becomes equal in amplitude and opposite in phase to distortion that occurs when the signals are amplified by the power amplifying sections.

29. A feed-forward type amplifying circuit, comprising:

a first power distributor for distributing an input signal into two signals;

a first vector adjusting circuit for adjusting an amplitude and a phase of one of the two signal distributed by the first power distributor;

a main amplifier for amplifying an output signal from the first vector adjusting circuit;

a second power distributor for distributing an output signal from the main amplifier into two signals:

a first delay circuit for delaying a phase of one of the two signal distributed by the first power distributor;

a distortion-detecting power combiner for combining an output signal from the first delay circuit and one of the two signals distributed by the second power distributor;

a second vector adjusting circuit for adjusting an amplitude and a phase of an output signal from the distortion-detecting power combiner;

an auxiliary amplifier for amplifying an output signal from the second vector adjusting circuit;

a second delay circuit for delaying another of the two signals distributed by the second power distributor; and a distortion-eliminating power combiner for combining an output signal from the auxiliary amplifier and an output signal from the second delay circuit, the main amplifier including:

a first power distributing section for distributing an input signal into two signals;

a first distortion generating section supplied with one of the two signals distributed by the first power distributing section for generating a distortion signal;

a first vector adjusting section for adjusting an amplitude and a phase of an output signal from the first distortion generating section;

a first propagation time delaying section for adjusting a propagation delay time of an output signal from the first vector adjusting section;

a second power distributing section for distributing another of the two signals distributed by the first power distributing section into two signals;

a second propagation time delaying section for adjusting a propagation delay time of one of the two signals distributed by the second power distributing section;

a second distortion generating section supplied with another of the two signals distributed by the second power distributing section for generating a distortion signal;

a second vector adjusting section for adjusting an amplitude and a phase of an output signal from the second distortion generating section;

a first power combining section for combining an output signal from the second propagation time delaying section and an output signal from the second vector adjusting section;

a third vector adjusting section for adjusting an amplitude and a phase of an output signal from the first power combining section;

a first power combining and distributing section for combining an output signal from the first propagation time delaying section and an output signal from the third vector adjusting section, and distributing the combined signal into two signals;

two power amplifying sections each for amplifying the two signals distributed by the first power combining and distributing section;

a second power combining and distributing section for combining the amplified two signals, and distributing the combined and amplified two signals into two signals; and a second power combining section for combining the two signals distributed by the second power combining and distributing section, wherein each of the first and second power combining and distributing sections is a 90-degree hybrid circuit, the first vector adjusting section adjusts the amplitude and the phase of the output signal so that a first distortion component included in a signal from the first propagation time delaying section to the first power combining and distributing section becomes equal in amplitude and opposite in phase to distortion that occurs when the signals are amplified by the power amplifying sections, and at least one of the second and third vector adjusting sections adjusts the amplitude and the phase of the output signal so that a second distortion component included in a signal from the third vector adjusting section to the first power combining and distributing section becomes equal in amplitude and opposite in phase to distortion that occurs when the signals including the first distortion component are amplified by the power amplifying sections.

30. A feed-forward type amplifying circuit, comprising:

a first power distributor for distributing an input signal into two signals;

a first vector adjusting circuit for adjusting an amplitude and a phase of one of the two signal distributed by the first power distributor;

a main amplifier for amplifying an output signal from the first vector adjusting circuit;

a second power distributor for distributing an output signal from the main amplifier into two signals:

a first delay circuit for delaying a phase of one of the two signals distributed from the first power distributor;

a distortion-detecting power combiner for combining an output signal from the first delay circuit and one of the two signals distributed by the second power distributor;

a second vector adjusting circuit for adjusting an amplitude and a phase of an output signal from the distortion-detecting power combiner;

an auxiliary amplifier for amplifying an output signal from the second vector adjusting circuit;

a second delay circuit for delaying a phase of another of the two signals distributed by the second power distributor; and a distortion-eliminating power combiner for combining an output signal from the auxiliary amplifier and an output signal from the second delay circuit, the main amplifier including:

a first power distributing section for distributing an input signal into two signals;

a second power distributing section for distributing one of the two signals distributed by the first power distributing section into two signals;

a first propagation time delaying section for adjusting a propagation delay time of an output signal from the second power distributing section;

a first distortion generating section supplied with another of the two signals distributed by the second power distributing section for generating a distortion signal;

a first vector adjusting section for adjusting an amplitude and a phase of an output signal from the first distortion generating section;

a third power distributing section for distributing another of the two signals distributed by the first power distributing section into two signals;

a second propagation time delaying section for adjusting a propagation delay time of one of the two signals distributed by the third power distributing section;

a fourth power distributing section for distributing an output signal from the second propagation time delaying section;

a second distortion generating section supplied with another of the two signals distributed by the third power distributing section for generating a distortion signal;

a second vector adjusting section for adjusting an amplitude and a phase of an output signal from the second distortion generating section;

a first power combining section for combining an output signal from the fourth power distributing section and an output signal from the first vector adjusting section;

a third vector adjusting section for adjusting an amplitude and a phase of an output signal from the first power combining section;

a second power combining section for combining an output signal from the first propagation time delaying section and an output signal from the third vector adjusting section;

a third power combining section for combining another of the two signals distributed from the fourth power distributing section and an output signal from the second vector adjusting section;

a fourth vector adjusting section for adjusting an amplitude and a phase of an output signal from the third power combining section;

a first power combining and distributing section for combining an output signal from the second power combining section and an output signal from the fourth vector adjusting section, and distributing the combined signal into two signals;

two power amplifying sections for amplifying the two signals distributed by the first power combining and distributing section;

a second power combining and distributing section for combining the amplified two signals, and distributing the combined and amplified two signals into two signals; and a second power combining section for combining the two signals distributed by the second power combining and distributing section, wherein each of the first and second power combining and distributing sections is a 90-degree hybrid circuit, at least one of the first and third vector adjusting sections adjusts the amplitude and the phase of the output signal so that a first distortion component included in a signal from the second power combining section to the first power combining and distributing section becomes equal in amplitude and opposite in phase to distortion that occurs when the signals are amplified by the power amplifying sections, and at least one of the second and fourth vector adjusting sections adjusts the amplitude and the phase of the output signal so that a second distortion component included in a signal from the fourth vector adjusting section to the first power combining and distributing section becomes equal in amplitude and opposite in phase to distortion that occurs when the signals including the first distortion component are amplified by the power amplifying sections.

31. A feed-forward type amplifying circuit, comprising:

a first power distributor for distributing an input signal into two signals;

a first vector adjusting circuit for adjusting an amplitude and a phase of one of the two signal distributed by the first power distributor;

a main amplifier for amplifying an output signal from the first vector adjusting circuit;

a second power distributor for distributing an output signal from the main amplifier into two signals:

a first delay circuit for delaying a phase of one of the two signal distributed from the first power distributor;

a distortion-detecting power combiner for combining an output signal from the first delay circuit and one of the two signals distributed by the second power distributor;

a second vector adjusting circuit for adjusting an amplitude and a phase of an output signal from the distortion-detecting power combiner;

an auxiliary amplifier for amplifying an output signal from the second vector adjusting circuit;

a second delay circuit for delaying another of the two signals distributed by the second power distributor; and a distortion-eliminating power combiner for combining an output signal from the auxiliary amplifier and an output signal from the second delay circuit, the main amplifier including:

a first power distributing section for distributing an input signal into two signals;

a first propagation time delaying section for adjusting a propagation delay time of one of the two signals distributed by the first power distributing section;

a second power distributing section for distributing one of the two signals distributed by the first power distributing section into two signals;

a second propagation time delaying section for adjusting a propagation delay time of one of the two signals distributed by the second power distributing section;

a distortion generating section supplied with another of the two signals distributed by the second power distributing section for generating a distortion signal;

a first vector adjusting section for adjusting an amplitude and a phase of an output signal from the distortion generating section;

a first power combining section for combining an output signal from the second propagation time delaying section and an output signal from the first vector adjusting section;

a third power distributing section for distributing an output signal from the first power combining section into two signals;

a second vector adjusting section for adjusting an amplitude and a phase of one of the two signals distributed by the third power distributing section;

a second power combining section for combining an output signal from the first propagation time delaying section and an output signal from the second vector adjusting section;

a third vector adjusting section for adjusting a phase and an amplitude of another of the two signals distributed by the third power distributing section;

a first power combining and distributing section for combining an output signal from the second power combining section and an output signal from the third vector adjusting section, and distributing the combined signal into two signals;

two power amplifying sections for amplifying the two signals distributed by the first power combining and distributing section;

a second power combining and distributing section for combining the amplified two signals, and distributing the combined and amplified two signals into two signals; and a second power combining section for combining the two signals distributed by the second power combining and distributing section, wherein each of the first and second power combining and distributing sections is a 90-degree hybrid circuit, the third vector adjusting section adjusts the amplitude and the phase of the output signal so that a first distortion component included in a signal from the second power combining section to the first power combining and distributing section becomes equal in amplitude and opposite in phase to distortion that occurs when the signals are amplified by the power amplifying sections, and at least one of the first and second vector adjusting sections adjusts the amplitude and the phase of the output signal so that a second distortion component included in a signal from the second vector adjusting section to the first power combining and distributing section becomes equal in amplitude and opposite in phase to distortion that occurs when the signals including the first distortion component are amplified by the power amplifying sections.

* * * * *